US012671946B2

(12) United States Patent
Bahr et al.

(10) Patent No.:  US 12,671,946 B2
(45) Date of Patent:  *Jun. 30, 2026

(54) PIEZOELECTRIC AUDIO DEVICE

(71) Applicant: Texas Instruments Incorporated, Dallas, TX (US)

(72) Inventors: Bichoy Bahr, Allen, TX (US); Udit Rawat, Dallas, TX (US); Mohit Chawla, Bangalore (IN); Yogesh Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 318 days.

This patent is subject to a terminal disclaimer.

(21) Appl. No.: 18/240,668

(22) Filed: Aug. 31, 2023

(65) Prior Publication Data

US 2025/0080920 A1     Mar. 6, 2025

(51) Int. Cl.
| | |
|---|---|
| *H04R 17/10* | (2006.01) |
| *H04R 3/04* | (2006.01) |
| *H04R 17/02* | (2006.01) |
| *H04R 29/00* | (2006.01) |
| *H10N 30/50* | (2023.01) |
| *H10N 30/87* | (2023.01) |

(52) U.S. Cl.
CPC .............. *H04R 17/10* (2013.01); *H04R 3/04* (2013.01); *H04R 17/02* (2013.01); *H04R 29/001* (2013.01); *H04R 29/004* (2013.01); *H10N 30/50* (2023.02); *H10N 30/871* (2023.02)

(58) Field of Classification Search
CPC .. H04R 17/02; H04R 17/10; H04R 2201/003; H04R 29/001; H04R 29/004; H10N 30/50; H10N 30/871
See application file for complete search history.

(56) References Cited

U.S. PATENT DOCUMENTS

| | | | |
|---|---|---|---|
| 2022/0377466 A1* | 11/2022 | Tanemura | ................ H04R 3/04 |
| 2022/0408196 A1 | 12/2022 | Ohara | |

(Continued)

OTHER PUBLICATIONS

Bahr et al., U.S. Appl. No. 18/240,676, filed Aug. 31, 2023.
United States Patent and Trademark Office, Office Action from U.S. Appl. No. 18/240,676, mailed Jun. 26, 2025, 19 pages.

*Primary Examiner* — James K Mooney
(74) *Attorney, Agent, or Firm* — Zhenhai Fu; Frank D. Cimino

(57) ABSTRACT

In one example, an audio device includes a substrate, a first piezoelectric flap, a second piezoelectric flap, a transmit circuit, a first receive circuit, a switch circuit, and a second receive circuit. The substrate has an opening. The first piezoelectric flap has a first end on the substrate and extending over the opening, the first piezoelectric flap having first and second terminals. The second piezoelectric flap has a second end on the substrate and extending over the opening, the second piezoelectric flap spaced from the first piezoelectric flap, the second piezoelectric flap having third and fourth terminals. The transmit circuit has driver outputs. The first receive circuit has first receiver inputs. The switch circuit coupled to the driver outputs and the first receiver inputs, and the first and second terminals. The second receive circuit has second receiver inputs coupled to the third and fourth terminals.

22 Claims, 22 Drawing Sheets

(56)                    References Cited

U.S. PATENT DOCUMENTS

| | | |
|---|---|---|
| 2023/0188896 A1 | 6/2023 | Barsukou |
| 2023/0243710 A1 | 8/2023 | Jomori |
| 2023/0270012 A1* | 8/2023 | Littrell ............... H10N 30/2042 |
| | | 310/357 |
| 2023/0403514 A1 | 12/2023 | Huang |

* cited by examiner

152/450

700

702 — DRIVING A FIRST PIEZOELECTRIC FLAP OF AN AUDIO DEVICE WITH A FIRST ELECTRICAL SIGNAL TO GENERATE AN ACOUSTIC SIGNAL

704 — RECEIVING A SECOND ELECTRICAL SIGNAL FROM A SECOND PIEZOELECTRIC FLAP OF THE AUDIO DEVICE RESPONSIVE TO THE ACOUSTIC SIGNAL

706 — DETERMINING A CHARACTERISTIC OF THE AUDIO DEVICE

708 — PERFORMING AN OPERATION BASED ON THE CHARACTERISTIC

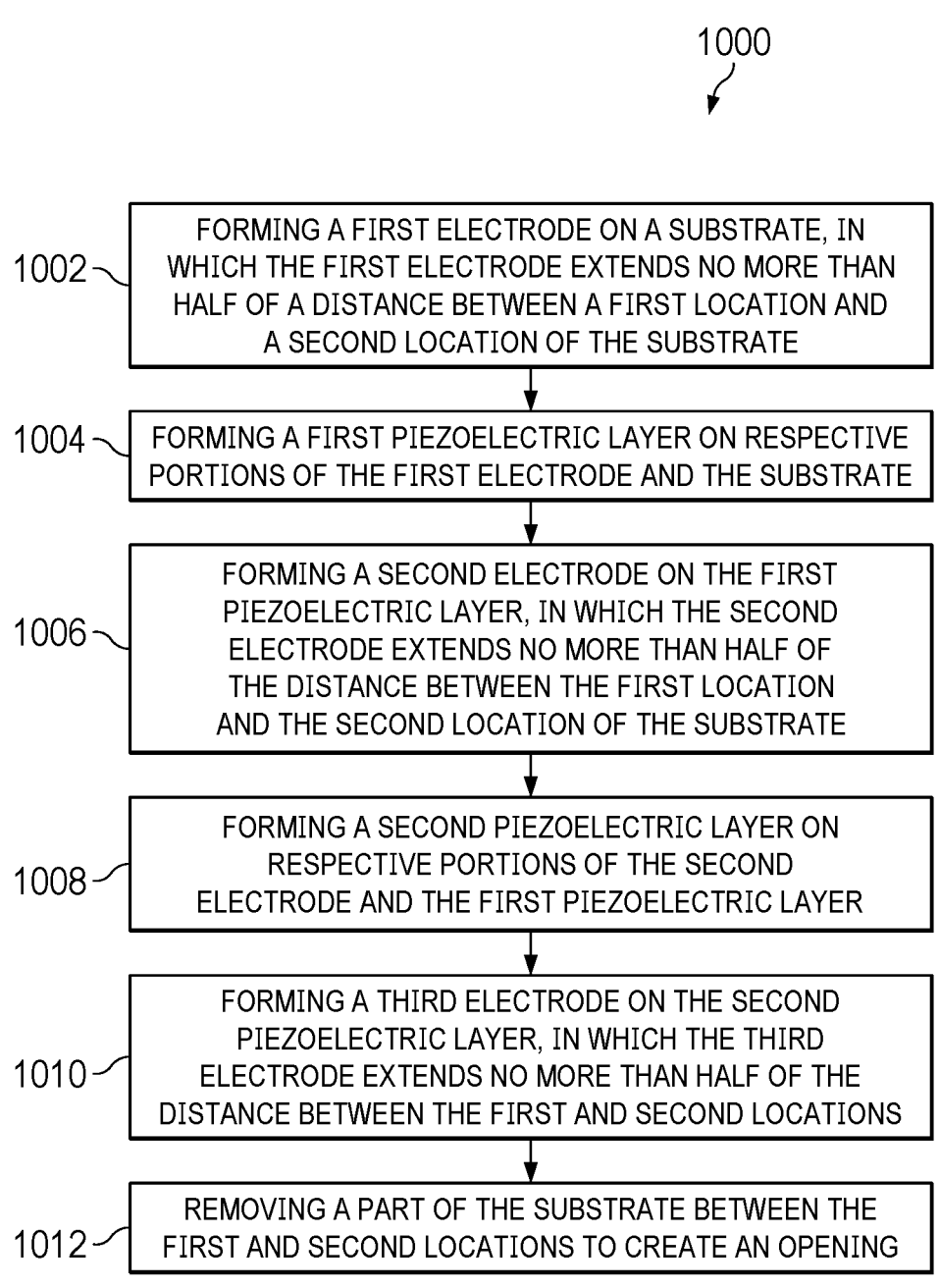

1000

1002 — FORMING A FIRST ELECTRODE ON A SUBSTRATE, IN WHICH THE FIRST ELECTRODE EXTENDS NO MORE THAN HALF OF A DISTANCE BETWEEN A FIRST LOCATION AND A SECOND LOCATION OF THE SUBSTRATE

1004 — FORMING A FIRST PIEZOELECTRIC LAYER ON RESPECTIVE PORTIONS OF THE FIRST ELECTRODE AND THE SUBSTRATE

1006 — FORMING A SECOND ELECTRODE ON THE FIRST PIEZOELECTRIC LAYER, IN WHICH THE SECOND ELECTRODE EXTENDS NO MORE THAN HALF OF THE DISTANCE BETWEEN THE FIRST LOCATION AND THE SECOND LOCATION OF THE SUBSTRATE

1008 — FORMING A SECOND PIEZOELECTRIC LAYER ON RESPECTIVE PORTIONS OF THE SECOND ELECTRODE AND THE FIRST PIEZOELECTRIC LAYER

1010 — FORMING A THIRD ELECTRODE ON THE SECOND PIEZOELECTRIC LAYER, IN WHICH THE THIRD ELECTRODE EXTENDS NO MORE THAN HALF OF THE DISTANCE BETWEEN THE FIRST AND SECOND LOCATIONS

1012 — REMOVING A PART OF THE SUBSTRATE BETWEEN THE FIRST AND SECOND LOCATIONS TO CREATE AN OPENING

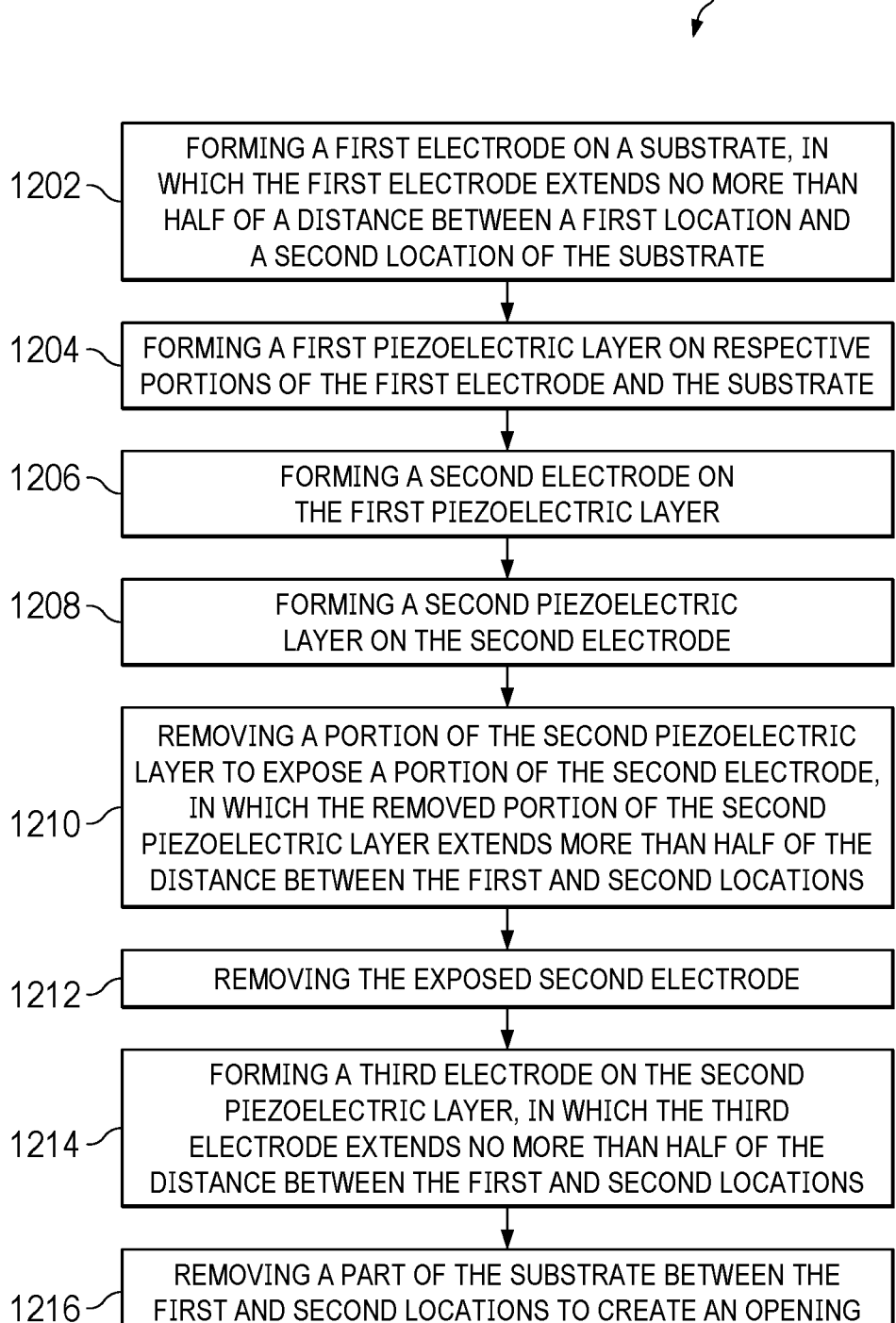

1202 — FORMING A FIRST ELECTRODE ON A SUBSTRATE, IN WHICH THE FIRST ELECTRODE EXTENDS NO MORE THAN HALF OF A DISTANCE BETWEEN A FIRST LOCATION AND A SECOND LOCATION OF THE SUBSTRATE

1204 — FORMING A FIRST PIEZOELECTRIC LAYER ON RESPECTIVE PORTIONS OF THE FIRST ELECTRODE AND THE SUBSTRATE

1206 — FORMING A SECOND ELECTRODE ON THE FIRST PIEZOELECTRIC LAYER

1208 — FORMING A SECOND PIEZOELECTRIC LAYER ON THE SECOND ELECTRODE

1210 — REMOVING A PORTION OF THE SECOND PIEZOELECTRIC LAYER TO EXPOSE A PORTION OF THE SECOND ELECTRODE, IN WHICH THE REMOVED PORTION OF THE SECOND PIEZOELECTRIC LAYER EXTENDS MORE THAN HALF OF THE DISTANCE BETWEEN THE FIRST AND SECOND LOCATIONS

1212 — REMOVING THE EXPOSED SECOND ELECTRODE

1214 — FORMING A THIRD ELECTRODE ON THE SECOND PIEZOELECTRIC LAYER, IN WHICH THE THIRD ELECTRODE EXTENDS NO MORE THAN HALF OF THE DISTANCE BETWEEN THE FIRST AND SECOND LOCATIONS

1216 — REMOVING A PART OF THE SUBSTRATE BETWEEN THE FIRST AND SECOND LOCATIONS TO CREATE AN OPENING

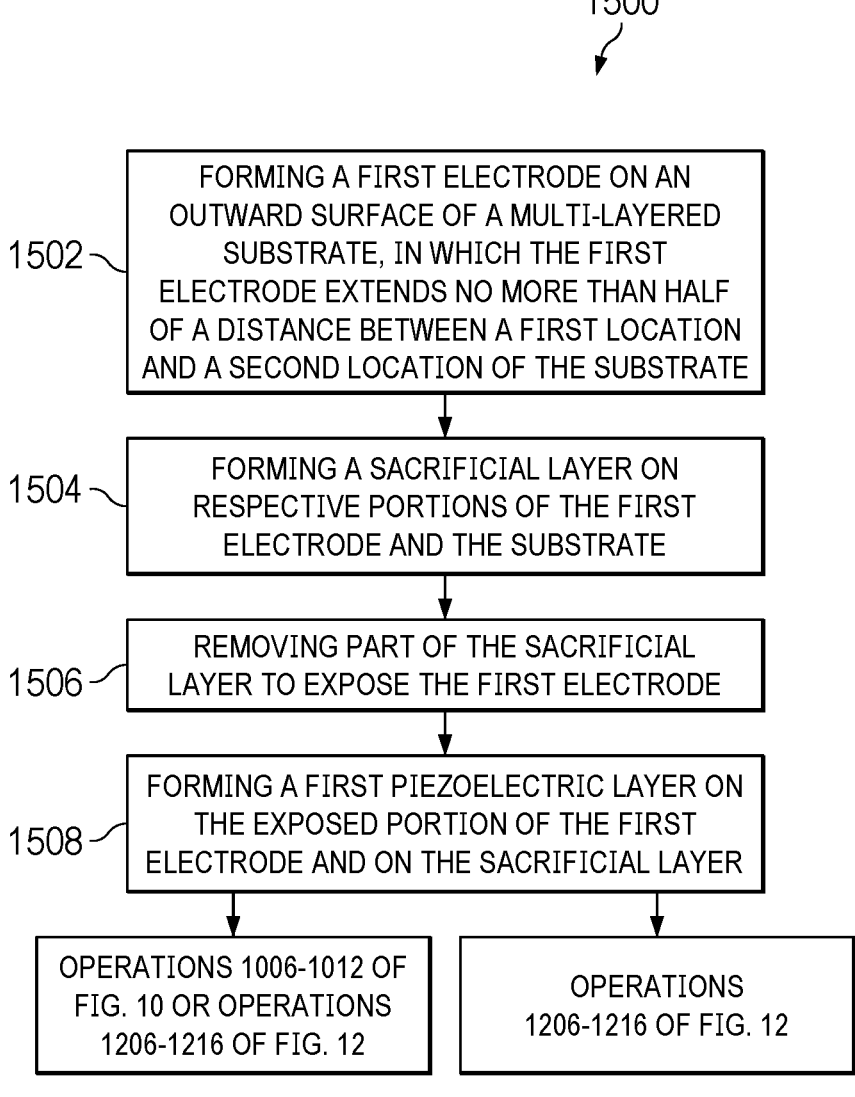

1502 — FORMING A FIRST ELECTRODE ON AN OUTWARD SURFACE OF A MULTI-LAYERED SUBSTRATE, IN WHICH THE FIRST ELECTRODE EXTENDS NO MORE THAN HALF OF A DISTANCE BETWEEN A FIRST LOCATION AND A SECOND LOCATION OF THE SUBSTRATE

1504 — FORMING A SACRIFICIAL LAYER ON RESPECTIVE PORTIONS OF THE FIRST ELECTRODE AND THE SUBSTRATE

1506 — REMOVING PART OF THE SACRIFICIAL LAYER TO EXPOSE THE FIRST ELECTRODE

1508 — FORMING A FIRST PIEZOELECTRIC LAYER ON THE EXPOSED PORTION OF THE FIRST ELECTRODE AND ON THE SACRIFICIAL LAYER

OPERATIONS 1006-1012 OF FIG. 10 OR OPERATIONS 1206-1216 OF FIG. 12

OPERATIONS 1206-1216 OF FIG. 12

PIEZOELECTRIC AUDIO DEVICE

RELATED APPLICATION

The present application is related to U.S. patent application Ser. No. 18/240,676, titled "Piezoelectric audio device", filed on Aug. 31, 2023, which is incorporated herein by reference in its entirety.

BACKGROUND

A piezoelectric transducer can convert between mechanical energy (e.g., vibration) and electrical energy using piezoelectric effect. An audio device, such a speaker, can include a piezoelectric membrane that can vibrate to generate audible sound waves/acoustic signal responsive to an audio signal. An audio device, such as a microphone, can also include a piezoelectric flap including electrodes that can vibrate responsive to external sound waves and generate electrical signals representing the sound waves. The electrical signals can then be further processed to, for example, generate an audio signal, or to extract other information.

The piezoelectric flap of an audio device may have a frequency response that peaks at a particular resonance frequency. The frequency response dictates how the piezoelectric flap converts between sound waves and audio signals across different frequencies. That resonant frequency can be based on a particular frequency of interest to improve separation of the desired audio signal and noise. The overall frequency response of a piezoelectric flap, including its resonant frequency, may be tuned at least initially by selecting the correct materials and dimensions. However, the resonance frequency can be affected by residual stress in the layers that make up the piezoelectric transducer. Such variations in stress may exist across a given piezoelectric flap as a result of initial processing and during the operational life of a piezoelectric transducer due to mechanical fatigue and/or through introduction of foreign matter (e.g., particulates or moisture). All these can lead to a shift in the actual frequency response of the piezoelectric flap from the designed/target frequency response, which can degrade the fidelity of the audio device in converting between the sound waves and the audio signals.

SUMMARY

In one example, an audio device includes a substrate, a first piezoelectric flap, a second piezoelectric flap, a transmit circuit, a first receive circuit, a switch circuit, and a second receive circuit. The substrate has an opening. The first piezoelectric flap has a first end on the substrate and extending over a first part of the opening, the first piezoelectric flap having first and second terminals. The second piezoelectric flap has a second end on the substrate and extending over a second part of the opening, the second piezoelectric flap spaced from the first piezoelectric flap, the second piezoelectric flap having third and fourth terminals. The transmit circuit has driver outputs. The first receive circuit has first receiver inputs. The switch circuit has first switch terminals and second switch terminals, the first switch terminals coupled to the driver outputs and the first receiver inputs, and the second switch terminals coupled to the first and second terminals. The second receive circuit has second receiver inputs coupled to the third and fourth terminals.

In one example, a method comprises driving a first piezoelectric flap of an audio device with a first electrical signal to generate an acoustic signal. The method further comprises receiving a second electrical signal from a second piezoelectric flap of the audio device responsive to the acoustic signal. The method also comprises determining a characteristic of the audio device based on the second electrical signal, and performing an action based on the characteristic.

BRIEF DESCRIPTION OF THE DRAWINGS

FIG. 10A is a flowchart illustrating a method of fabricating the example piezoelectric bimorph of FIGS. 9A and 9B.

FIG. 12A is a flowchart illustrating a method of fabricating the example piezoelectric bimorph of FIGS. 11A and 11B.

FIG. 15A is a flowchart illustrating a method of fabricating the example piezoelectric bimorphs of FIGS. 13A-14B.

The same reference numbers or other reference designators are used in the drawings to designate the same or similar (functionally and/or structurally) features. The figures are not necessarily drawn to scale.

DETAILED DESCRIPTION

Figure 1A:
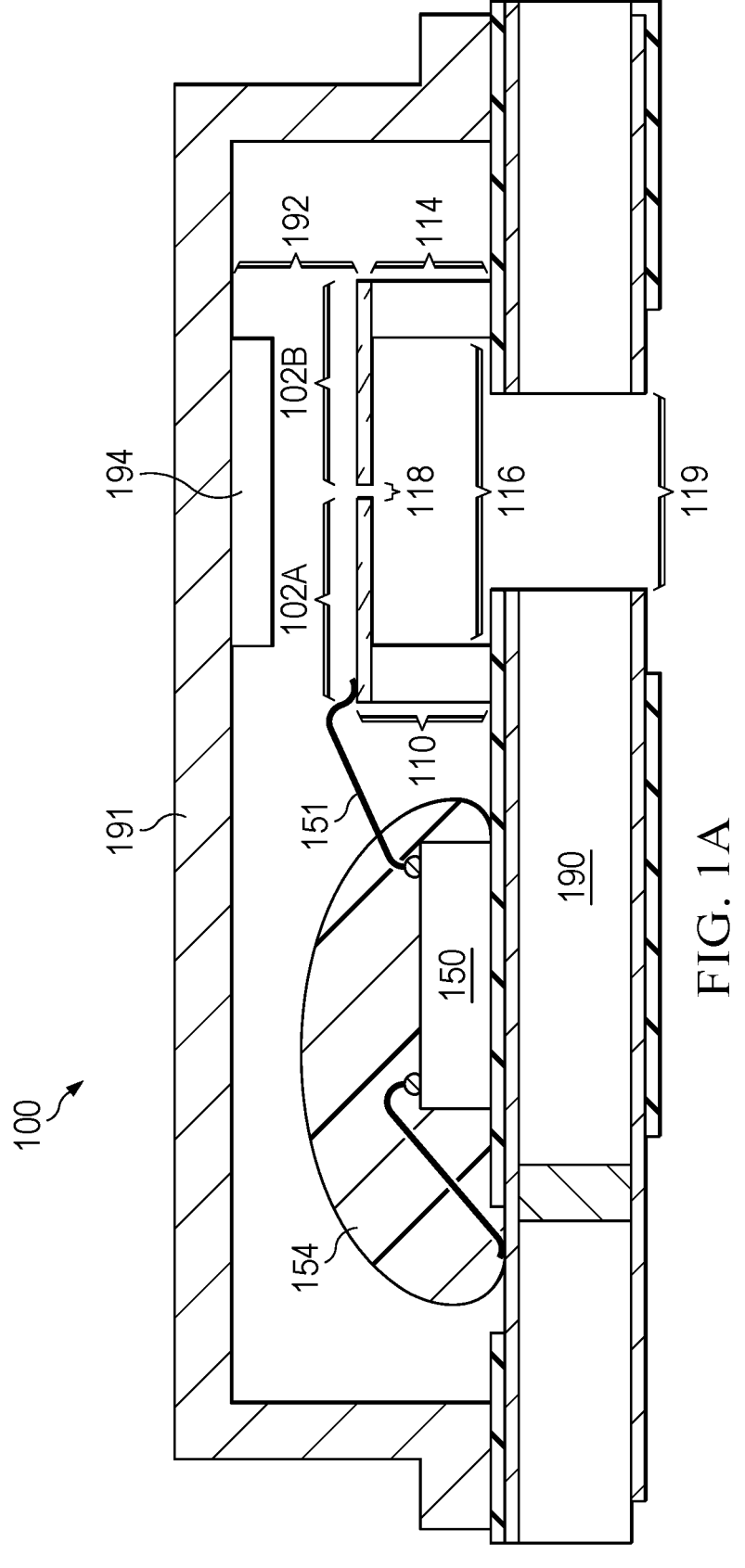
FIG. 1A and FIG. 1B are schematics of an example piezoelectric audio device.

FIG. 1A shows an example audio device 100. In some examples, audio device 100 can be configured as a microphone. In some examples, audio device 100 can be configured as a speaker. Audio device 100 may be a packaged device including a piezoelectric cantilever system 110 and an integrated circuit 150 on a substrate 190. Substrate 190 can be a package substrate, a printed circuit board (PCB), etc.

Piezoelectric cantilever system 110 includes a plurality of piezoelectric flaps, such as 102A and 102B. Each membrane has one end coupled to a structure 114 (e.g., a semiconductor structure) having an opening 116, and the other end of each flap can move up/down as a cantilever/flap over opening 116. The flaps are separated by a gap/slit 118, which allows each flap to move independently with respect to each other in certain operations. As to be described below, each piezoelectric flap of piezoelectric cantilever system 110 is individually addressable/controllable, where each flap can be operated independently as a sensor (e.g., as part of a microphone to detect and convert sound waves into an electrical signal) or as an actuator (e.g., as a speaker to generate sound waves, or otherwise to move the flap).

In some examples, the piezoelectric cantilever system 110 may be a micro-electromechanical system (MEMS) or nano-electromechanical system (NEMS), in which the flaps are fabricated within micron or nanometer dimensions, respectively. Certain MEMS or NEMS technologies may provide several benefits, such as batch fabrication that may lower manufacturing costs, small feature sizes, high resonant frequencies, and improved impedance matching.

The integrated circuit 150 is communicatively coupled to the piezoelectric cantilever system 110 by an interconnect (e.g., bond wire 151) and may be encapsulated in an epoxy 154. The integrated circuit 150 can include a control and processing circuit (CPC) 152 and a set of switches, both are to be shown in FIG. 1B, to operate each individually controllable piezoelectric bimorph flaps to perform the aforementioned self-test, self-calibration, and self-cleaning operations. In some examples, the piezoelectric cantilever system 110 and the integrated circuit 150 are on separate dies as shown in FIG. 1A. In some examples the piezoelectric cantilever system 110 and the integrated circuit 150 are on a same die.

Substrate 190 also includes an opening 119 that joins opening 116 and exposes piezoelectric flaps to the exterior of audio device 100. Openings 116 and 120 can define a front volume space (or an audio port). In a case where the CPC 152 operates the piezoelectric flaps as part of a microphone, the piezoelectric flaps can detect sound waves that propagate from the exterior of audio device 100 via the front volume space defined by openings 120 and 116, and generate electrical signals responsive to the detection of the sound waves. Also, as to be described below, in a self-test operation, the CPC 152 can drive one or more piezoelectric flaps of piezoelectric cantilever system 110 (e.g., flap 102A) as an actuator to generate internal sound waves, and operate another one or more piezoelectric flaps of piezoelectric cantilever system 110 (e.g., flap 102B) as a sensor. The internal sound waves can propagate through the front volume space/audio port and reach flap 102B, which can generate electrical signals responsive to detecting the internal sound waves. From the electrical signals, the CPC 152 can extract various properties of the piezoelectric flaps (e.g., frequency response, resonant frequency, etc.) as the results of the self-test operation.

Audio device 100 also includes a case 191 mounted on substrate 190. Case 191 can cover the piezoelectric cantilever system 110, the integrated circuit 150, the bond wire 151 and the epoxy material 154. The case 191 can be made of any suitable material, such as metal, plastic, etc., to shield the piezoelectric cantilever system 110 and the integrated circuit 150 from noise and mechanical stress. The case 191 can also define a back volume space 192 in which the piezoelectric flaps of the piezoelectric cantilever system 110 can move (e.g., vibrate). The back volume space 192 can be filled with air. Slit/gap 118 allows air to flow between the back volume space 192 and the front volume space (defined by openings 116 and 120) to equalize the air pressure on two sides of the piezoelectric flaps, to prevent additional stress which may otherwise rupture or reduce the sensitivity of the piezoelectric flaps in operating as a microphone. The slit/gap 118 is also narrow (e.g., 1 micrometer (um)) to prevent the sound waves from reaching the back volume space 192, and can set the lower cut-off frequency of the microphone.

As to be described below, CPC 152 can also perform an equalization operation and/or a self-cleaning operation based on the results of the self-test operation. For example, CPC 152 can determine a frequency response of piezoelectric cantilever system 110 based on the self-test operation, and determine a set of equalization coefficients based on the frequency response. When operating the piezoelectric cantilever system 110 as a microphone, CPC 152 can perform an equalization operation on the electrical signals received from the piezoelectric cantilever system 110 using the set of equalization coefficients, to obtain a desired/target frequency response for the audio device 100 (e.g., a flat frequency response across a particular frequency range, a peak response at a particular resonant frequency, etc.). As another example, from the self-test operation, CPC 152 can detect foreign object (e.g., moisture) on the piezoelectric flaps, in back volume space 192, in the front volume space, etc. Responsive to the detection of the foreign object, CPC 152 can transmit electrical driving signals to vibrate the piezoelectric flaps to remove the foreign object. CPC 152 may also determine the resonant frequency of the piezoelectric cantilever system 110 from the self-testing, and drive the piezoelectric flaps at the resonant frequency, to maximize (or at least increase) the driving and cleaning efficiency.

In some examples, audio device 100 may also include a heating element 194 (e.g., a resistor) to support the self-cleaning operation. Heating element 194 can be activated by CPC 152 to radiate heat to facilitate the removal of moisture (e.g., through vaporization) in audio device 100. For example, as shown in FIG. 1A, heating element 194 can be positioned within back volume space 192 (e.g., attached on case 191) to heat up the moisture in the back volume space and/or on the piezoelectric flaps, and the moisture can evaporate out of openings 116 and 119 via gap/slit 118. Heating element 194 can also be positioned on or proximate IC 150, package substrate 190, and/or piezoelectric cantilever system 110 to interface with back volume space 192. As another example, heater 194 can be positioned proximate openings 116 and/or 119 to evaporate the moisture present in the front volume space.

Figure 1B:
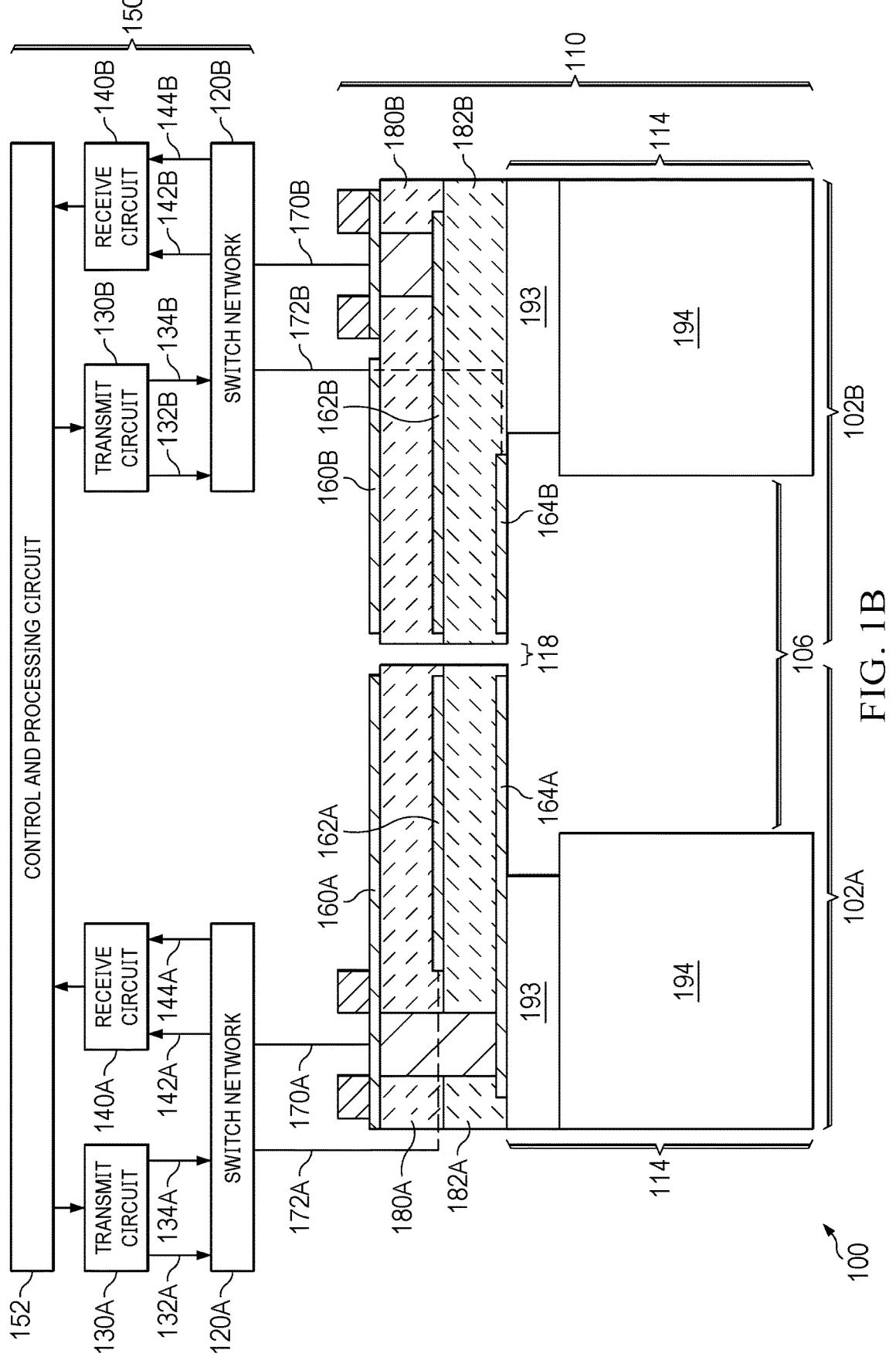

FIG. 1B is block diagram of illustrating internal components of the piezoelectric cantilever system 110 and the integrated circuit 150. As shown in FIG. 1B, the integrated circuit 150 includes piezoelectric cantilever system 110 one or more switch networks 120A-120B, one or more transmit circuits 130A-130B, one or receive circuits 140A-140B, and the CPC 152.

Figure 4:
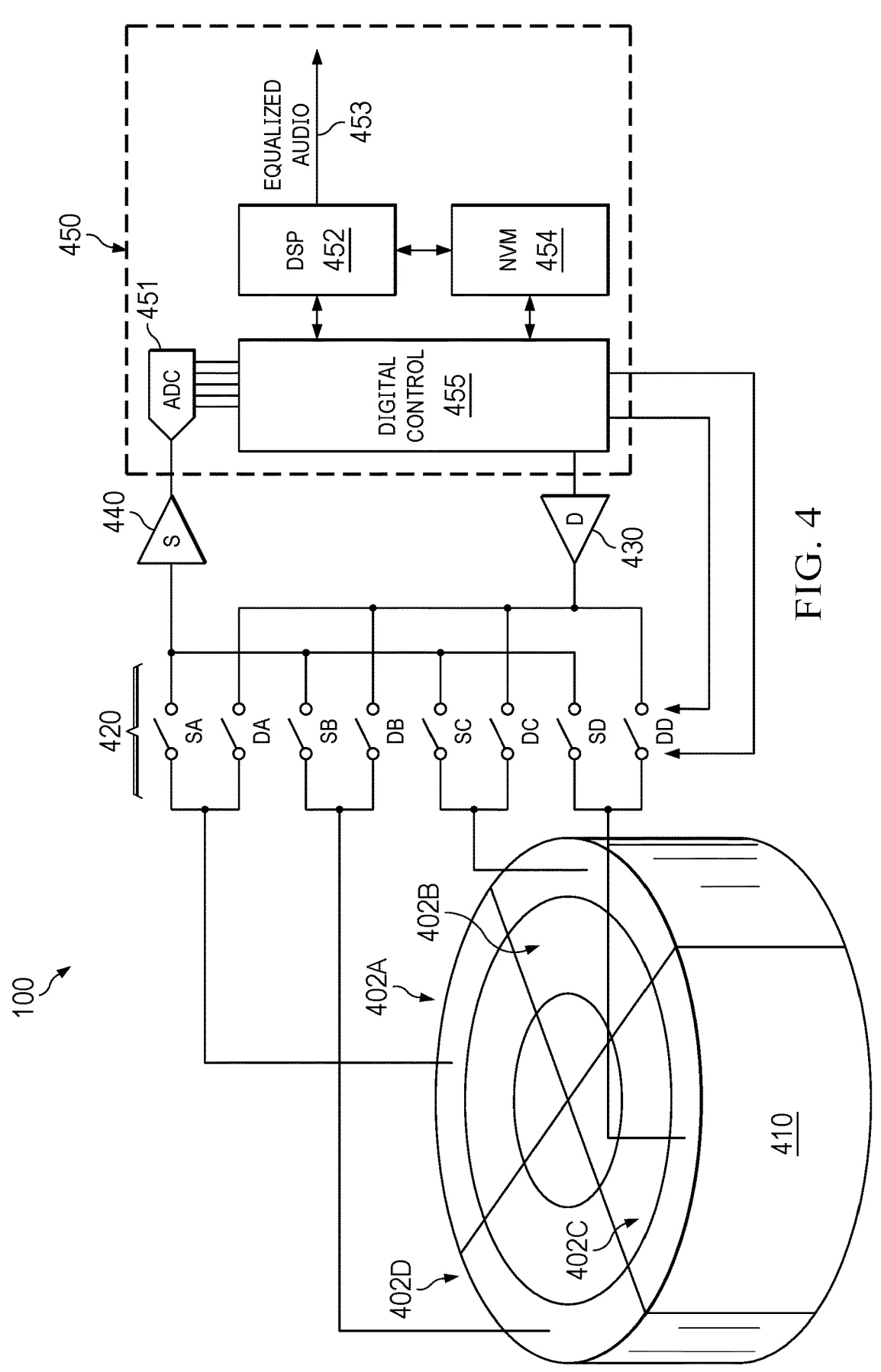
FIG. 4 is a schematic illustrating another example of the piezoelectric audio device of FIG. 1.

Referring to FIG. 1B, piezoelectric cantilever system 110 includes two piezoelectric flaps 102A-102B. Each piezoelectric flap can be a piezoelectric bimorph flap having a multi-layer structure. Each bimorph flap has a top electrode, a middle electrode, a bottom electrode, a first piezoelectric layer between the top electrode and the middle electrode, and a second piezoelectric layer between the middle electrode and the bottom electrode. Although the illustrated portion of piezoelectric system 110 shows two bimorph flaps 102A and 102B, piezoelectric cantilever system 110 may include any suitable number of flaps 102. FIG. 4, for example, illustrates a perspective view of a piezoelectric microphone 410 having four flaps 402A, 402B, 402C, and 402D.

Bimorph flaps 102A and 102B are formed on structure 114, which can include multiple layers forming a stack. For example, structure 114 can include an oxide layer 192 and a substrate 194 (e.g., a silicon substrate). As described above, structure 114 includes opening 106 formed there-through, which permits sound waves to be transmitted to or from flaps 102A and 102B through opening 106. Bimorph flaps 102A and 102B are both cantilevered, such that respective fixed portions are on structure 114 and respective moveable portions extend over respective portions of opening 106. As described above, bimorph flaps 102A and 102B separate back volume space 192 of the audio device 100 from opening 106.

As shown in FIG. 1B, bimorph flap 102A has a top electrode 160A, a middle electrode 162A, and a bottom electrode 164A. At least a portion of middle electrode 162A is between top electrode 160A and bottom electrode 164A. Bimorph flap 102A also has at least two piezoelectric layers 180A and 182A. Piezoelectric layer 180A has at least a portion between top electrode 160A and middle electrode 162A. Piezoelectric layer 182A has at least a portion between middle electrode 162A and bottom electrode 164A. Top and bottom electrodes 160A and 164A are coupled to a terminal 170A. Middle electrode 162A is coupled to another terminal 172A.

Also, bimorph flap 102B has a top electrode 160B, a middle electrode 162B, and a bottom electrode 164B. At least a portion of middle electrode 162B is between top electrode 160B and bottom electrode 164B. Bimorph flap 102B also has at least two piezoelectric layers 180B and 182B. Piezoelectric layer 180B has at least a portion between top electrode 160B and middle electrode 162B. Piezoelectric layer 182B has at least a portion between middle electrode 162B and bottom electrode 164B. Top and bottom electrodes 160B and 164B are coupled to a terminal 172B. Middle electrode 162B is coupled to another terminal 170B.

Electrodes 160A-160B, 162A-162B, and 164A-164B may each be formed from one or more layers of any suitable conductive material(s). Piezoelectric layers 180A-180B and 182A-182B, and 184A-184B may each be formed of any suitable piezoelectric material(s). In some examples, electrodes 160A-164B and piezoelectric layers 180A-184B may all be formed using material(s) compatible with certain CMOS processing. For example, molybdenum (Mo or "moly") may be used to form electrodes 160A-160B, 162A-162B, and 164A-164B and aluminum nitride ("AlN") may be used to form piezoelectric layers 180A-180B and 182A-182B, and 184A-184B. However, any suitable bimorph material(s) may be used to form electrodes 160A-160B, 162A-162B, and 164A-164B and piezoelectric layers 180A-180B and 182A-182B, and 184A-184B.

Terminals 170A, 172A, 170B and 172B can include any suitable electrical connector configured to transfer electrical current. As shown in FIG. 1B, for example, terminals 170A and 170B may be used to electrically couple bimorph flap 102A to switch network 120A. Terminals 170B and 172B may be used to electrically couple bimorph flap 102B to switch circuit 120B.

Switch circuits 120A and 120B can include any suitable electrical component(s) configured to disconnect or connect conductive paths interconnecting CPC 152 to bimorph flap 102A and 102B, respectively. For example, switch circuit 120A may be configured to disconnect or connect respective conductive paths to terminals 170A and 172A; and switch circuit 120B may be configured to disconnect or connect respective conductive paths to terminals 170B and 172B. Switch circuit 120A may have input terminals coupled to driver outputs 132A-134A of transmit circuit 130A and may further have output terminals coupled to receiver inputs 142A-144A of receive circuit 140A. Switch circuit 120B may similarly have input terminals coupled to driver outputs 132B-134B of transmit circuit 130B and may further have output terminals coupled to receiver inputs 142B-144B of receive circuit 140B.

Transmit circuits 130A and 103B can include circuitry that receives electric signals (e.g., audio signal, a self-cleaning signal, etc.) from CPC 152 at their inputs and transmits corresponding electric signals to bimorph flaps 102A and 102B via switch circuit 120A and 120B, respectively, to generate sound waves and/or to vibrate the bimorph flaps. Each of transmit circuits 130A and 130B may include an audio driver circuit. Transmit circuit 130A has multiple driver outputs 132A- and 134A coupled to corresponding inputs of switch circuit 120A. Transmit circuit 130B has multiple driver outputs 132B-134B coupled to corresponding inputs of switch circuit 120B. In operation, CPC 152 may provide a signal (e.g., an audio signal, a self-cleaning signal) to transmit circuit 130A or 130B, which convert the signal to electrical driving signals having one or more frequencies to bimorph flaps 102A and/or 102B, respectively. Transmit circuit 130A may provide electrical driving signals having a potential difference across driver outputs 132A-134A via switch circuit 120A to generate an alternating electric field across bimorph flap 102A, which causes bimorph flap 102A to vibrate. Also, transmit circuit 130B may provide electrical driving signals having a potential difference across driver outputs 132B-134B via switch circuit 120B to generate an alternating electric field across bimorph flap 102B, which causes bimorph flap 102B to vibrate.

Receive circuit 140A can include circuitry that receives electrical signals at receiver inputs 142A and 144A, which represent an electric field between electrodes 160A/164A and 162A that reflect a stress in bimorph flap 102A due to the sound waves, and provides corresponding electrical signals to CPC 152. For example, bimorph flap 102A may be configured to vibrate responsive to soundwaves, resulting in stress that is converted into an electrical signal that is provided to receive circuit 140A via inputs 142A and 144A. Receive circuit 140A may perform a conversion operation on received electrical signals. For example, receive circuit 140A may perform an analog-to-digital conversion that involves receiving analog electrical signals at receiver inputs 142A and 144A and converting the received analog electrical signals to digital electrical signals. The converted digital electrical signals may then be provided to CPC 152. Alternatively, receive circuit 140A may provide analog signals to CPC 152, which CPC 152 may then convert to digital signals using an internal analog-to-digital converter (as described herein with reference to FIG. 4).

Receive circuit 140B can include circuitry that receives electrical signals at receiver inputs 142B and 144B, which represent an electric field between electrodes 160B/164B and 162B that reflect a stress in bimorph flap 102B due to the sound waves, and provides corresponding electrical signals to CPC 152. For example, bimorph flap 102B may be configured to vibrate responsive to sound waves, resulting in stress that is converted into an electrical signal that is provided to receive circuit 140B via inputs 142B or 144B. Receive circuit 140B may perform a conversion operation on received electrical signals. For example, receive circuit 140B may perform an analog-to-digital conversion that involves receiving analog electrical signals at receiver inputs 142B an 144B and converting the received analog electrical signals to digital electrical signals. The converted digital electrical signals may then be provided to CPC 152. Alternatively, receive circuit 140B may provide analog signals to CPC 152, and CPC 152 may convert the analog signals to digital signals using an internal analog-to-digital converter (as described herein with reference to FIG. 4).

CPC 152 can include circuitry capable of providing audio/self-testing signals to piezoelectric cantilever system 110, receiving electrical signals from piezoelectric cantilever system 110 representing detection of sound waves, controlling a variety of operating modes of piezoelectric cantilever system 110, and providing processing functions concerning the provided electrical driving signals or received response signals. In some examples, CPC 152 can be part of an application specific integrated circuit (ASIC). In some examples, CPC 152 may include one or more physical processor devices executing instructions stored in non-transitory memory to perform the processing and control functions.

Each bimorph flap 102A and 102B may be configured to vibrate responsive to an electrical driving signal or to pressure waves applied thereto. When being electrically driven, one or more of bimorph flaps 102A and 102B may be configured to vibrate responsive to a respective electrical driving signal provided by CPC 152 (e.g., via transmit circuit 130A or 130B and switch circuit 120A or 120B). For example, CPC 152 may provide (via the transmit circuit) a first driving signal to bimorph flap 102A, in which bimorph flap 102A is configured to vibrate at a first frequency responsive to the first driving signal; and CPC 152 may provide a second driving signal to bimorph flap 102B, in which bimorph flap 102B is configured to vibrate at a second frequency responsive to the second driving signal. The first and second electrical driving signals may each have a respective response frequency spectrum. In certain instances, the respective response frequency spectrums for the first and second driving signals may be substantially the same as each other. In certain other instances, the respective response frequency spectrums for the first and second driving signals may be substantially different.

When being mechanically driven (e.g., by sound waves), for example, one or more of bimorph flaps 102A and 102B may be configured to vibrate responsive to the sound waves, resulting in stress that is converted into an electrical signal that is provided to and received by CPC 152 (e.g., via switch circuit 120A or 120B and receive circuit 140A or 140B). Additional detail regarding certain example modes of operation is explained further herein with reference to FIGS. 2-5.

Figure 2:
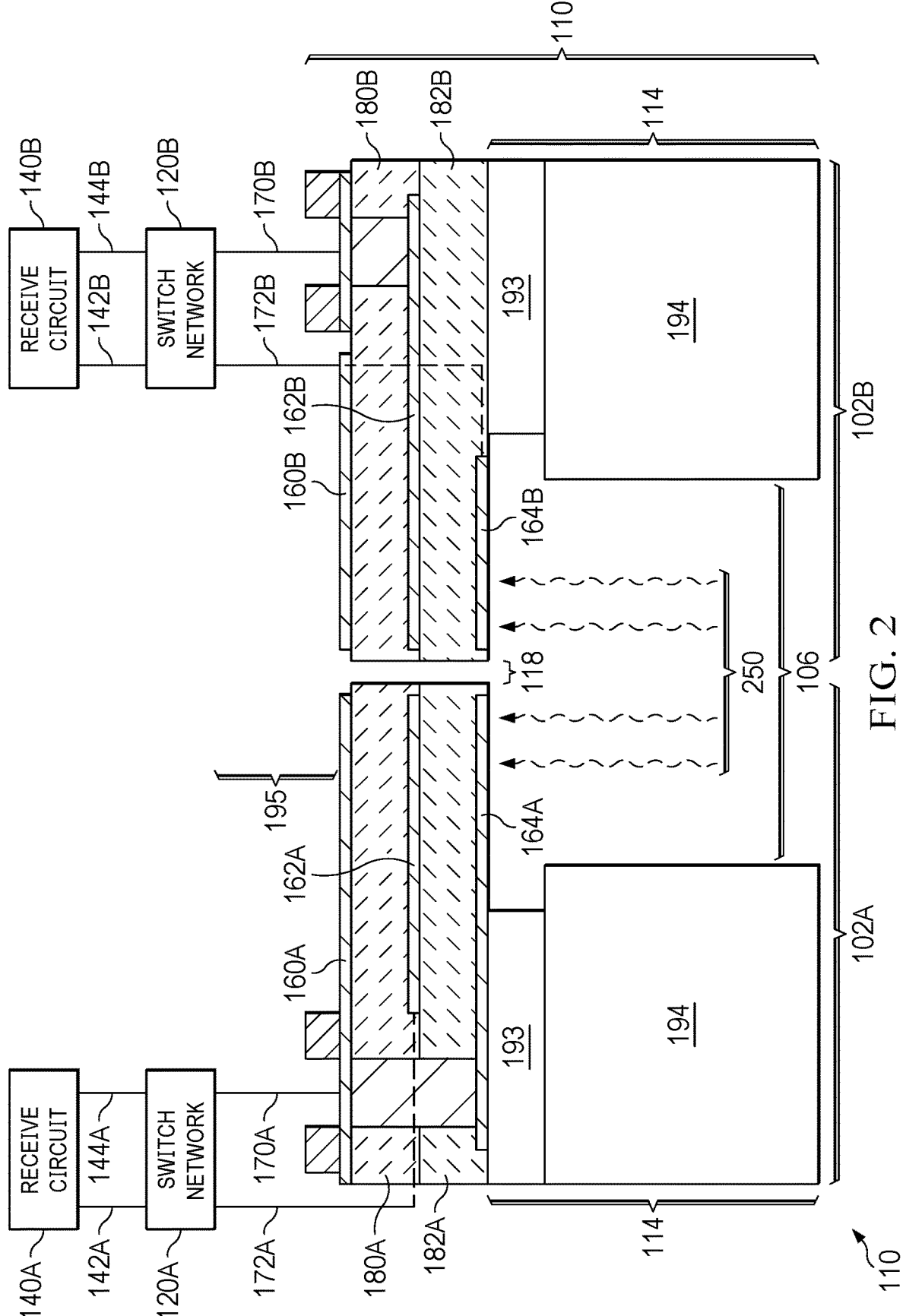
FIG. 2 is a schematic illustrating example operations of the audio device of FIG. 1 in a microphone mode.

FIG. 2 is block diagram of a portion of the piezoelectric cantilever system 110 of FIG. 1A and FIG. 1B, in which the CPC 152 operates both bimorph flaps 102A and 102B according to a microphone mode. While operating according to a microphone mode, sound waves may pass through opening 106 toward bimorph flaps 102A and 102B. Bimorph flaps 102A and 102B vibrate responsive to the sound waves, resulting in stress that is converted into an electrical signal. The electrical signal generated by bimorph flap 102A is conducted via terminals 170A and 172A to switch circuit

120A. With the proper switch settings, switch circuit 120A conducts the converted electrical signal to receiver inputs 142A-144A of receive circuit 140A. Receive circuit 140A provides the electrical signal (generated by bimorph flap 102A) to CPC 152.

The electrical signal generated by bimorph 102B is provided to CPC 152 in a similar manner. The converted electrical signal can propagate via terminals 170B and 172B to switch circuit 120B. With the proper switch settings, switch circuit 120B forwards the converted electrical signal to receiver inputs 142B-144B of receive circuit 140B. Receive circuit 140B provides the electrical signal (generated by bimorph flap 102B) to CPC 152.

CPC 152 may be further configured to perform various operations responsive to receiving an electrical signal from receive circuit 140A and/or 140B. For example, CPC 152 may generate a response frequency spectrum based on a received response signal, store data representing the response frequency spectrum in a memory, compare the response frequency spectrum with a reference frequency spectrum, and provide a status indication based on a result of the comparison. Such status indications may include, for example, one of: presence of moisture on a bimorph flap 102A or 102B, presence of moisture in a back volume of the piezoelectric cantilever system 110 separated from the opening 106 by bimorph flaps 102A and 102B (e.g., back volume 195 of FIG. 3), the mechanical integrity of the back volume, a distance of gap/slit 118 between bimorph flaps 102A and 102B exceeding a limit.

Figure 3:
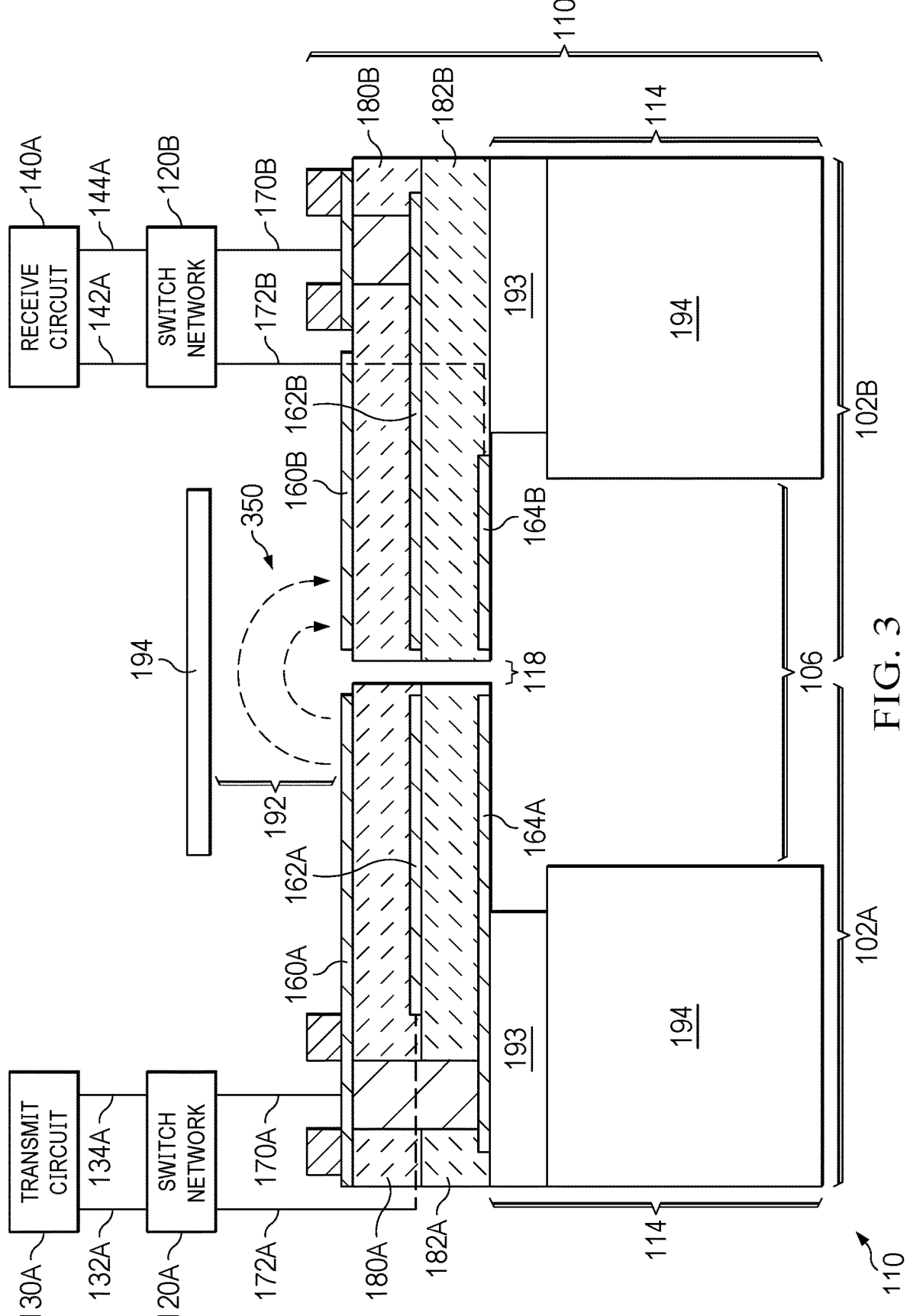
FIG. 3 is a schematic illustrating example operations of the piezoelectric audio device of FIG. 1 in a self-test mode.

FIG. 3 is block diagram of a portion of the piezoelectric cantilever system 110 of FIG. 1, in which CPC 152 operates bimorph flaps 102A and 102B according to a self-test mode. While operating in a self-test mode, CPC 152 may provide a first electrical driving signal via transmit circuit 130 and switch circuit 120 to bimorph flap 102A. In this example, by configuring switch circuits 120A and 120B and having bimorph flaps 102A and 102B independently controllable, the first electrical driving signal is not provided to bimorph flap 102B. Bimorph flap 102A is configured to vibrate at a first frequency responsive to the first provided electrical driving signal. The responsive vibration of bimorph flap 102A creates pressure/sound waves 350, which propagate via back volume space 192 towards bimorph flap 102B.

Bimorph flap 102B vibrates responsive to the sound/ pressure waves generated by the electrically-driven vibration of bimorph flap 102A. The vibration of bimorph flap 102B results in stress that is converted into an electrical signal. The electrical signal generated by bimorph 102B is conducted via terminals 170B and 172B to switch circuit 120B. With the proper switch settings, switch circuit 120B conducts the frequency response electrical signal to receiver inputs 142B-144B of receive circuit 140B. Receive circuit 140B provides the electrical signal (generated by bimorph flap 102B) to CPC 152.

The self-test operation can be performed for different characterizations of piezoelectric cantilever system 110. In some examples, the self-test operation can be performed using driving signals at a particular frequency to determine whether any of the bimorph flap under test fails to vibrate and/or fails to generate an electrical signal at that frequency. In some example, as to be described below, the CPC 152 can perform the self-test operation by providing the driving signals at different frequencies (e.g., separated by a particular frequency interval based on a frequency sweep) to bimorph flap 102A, which can vibrate to generate sound waves. In some examples, The CPC 152 can provide different monotonic driving signal having different frequencies at different times. In some examples, CPC 152 can also provide a multi-tone driving signal having different frequencies. The CPC 152 can receive the electrical signals generated by bimorph flap 102B responsive to the sound waves at the different frequencies, and perform processing to determine various frequency response characteristics, such as lower cut-off frequency, resonant frequency, quality factor, etc., of piezoelectric cantilever system 110 as results of the self-test operation. The CPC 152 may compare the frequency response obtained from the self-test operation with a reference frequency spectrum, and provide a status indication based on a result of the comparison. Such status indications may include, for example, one of: presence of moisture on a bimorph flap 102A or 102B, presence of moisture in back volume space 192, the mechanical integrity of back volume space 192, or a gap distance between bimorph flaps 102A and 102B exceeding a limit.

In addition, the CPC 152 may perform additional processing operations, such as determination of equalization coefficients, based on these results of the self-test operation. When operating the piezoelectric cantilever system 110 in the microphone mode, the CPC 152 can perform equation operations using the equalization coefficients on the electrical signals generated by the piezoelectric cantilever system 110, so that the conversion between sound waves and electrical signals by the audio device 100 can follow a particular response characteristic (e.g., a flat response across a particular frequency range, a peak response at a particular resonant frequency, a particular quality factor at the peak response, etc.)

Any suitable ratio of electrically-driven bimorph flaps and mechanically-driven bimorph flaps may be used in performing certain operations. Example ratios of electrically-driven bimorph flaps to mechanically-driven bimorph flaps that may be applied in performing certain self-test modes of operation are described further with reference to FIG. 4.

FIG. 4 is another simplified system block diagram of audio device 100. In this example, audio device 100 includes piezoelectric cantilever system 410, switch circuit 420, a transmit circuit 430, a receive circuit 440, and a control and processing circuit ("CPC") 450.

In this example, piezoelectric system 410 is cylindrically shaped, with four bimorph flaps 402A, 402B, 402C, and 402D each extending toward center. Bimorph flaps 402A, 402B, 402C, and 402D are separated from one another by airgap slits collectively forming a cross-like shape. In some examples, piezoelectric system 410 may be part of or may include piezoelectric cantilever system piezoelectric cantilever system 110 of FIGS. 1A and 1B. Each bimorph flap 402A, 402B, 402C, and 402D has a respective electrical interconnection with switch circuit 420. The respective electrical interconnections between bimorph flaps 402A, 402B, 402C, and 402D and switch circuit 420 may be electrically isolated from one another, such that each bimorph flap 402A, 402B, 402C, 402D may be individually driven by a respective electrical signal, and each bimorph flap 402A, 402B, 402C, 402D may individually and independently transmit a respective electric signal.

Switch circuit 420, which can include or can be part of switch circuits 120A and 120B of FIGS. 1A and 1i, has a plurality of switches DA, DB, DC, DD, SA, SB, SC, and SD. Although FIG. 4 illustrates each switch DA, DB, DC, DD, SA, SB, SC, and SD as a single-pole, single-throw (SPST) switch, any suitable switch type(s) may be used. In this example, switches DA, DB, DC, and DD open or close to enable CPC 450 to provide electrical driving signals via transmit circuit 430 to corresponding bimorph flaps 402A, 402B, 402C, and 402D, respectively. Switches SA, SB, SC, and SD open or close to enable bimorph flaps 402A, 402B, 402C, and 402D to provide electrical signals to CPC 450 responsive to sound waves (or other mechanical vibrations) via receive circuit 440.

The switch arrangement shown in FIG. 4 enables different operations at piezoelectric cantilever system 410. According to one arrangement, for example, CPC 450 closes switches DA, DB, and DC, and SD, and CPC 450 opens the remainder of switches DD, SA, SB, and SC, such that an electrical driving signal may be provided by CPC 450 to bimorph flaps 402A, 402B, and 402C simultaneously, without providing the same electrical driving signal to bimorph flap 402D. Such a switch arrangement may enable a self-test mode of operation having a 3:1 ratio, in which bimorph flaps 402A, 402B, and 402C are electrically driven to vibrate at resonant frequency responsive to the electrical driving signal, and bimorph flap 402D generates an electric signal by its vibrations responsive to the pressure waves created by the electrically-driven vibrations of bimorph flaps 402A, 402B, and 402C.

According to another example arrangement, CPC 450 closes switches DA, SB, SC, and SD, and CPC 450 opens the remainder of switches DB, DC, DD, and SA, such that an electrical driving signal may be provided by CPC 450 to bimorph flap 402A only, without providing the same electrical driving signal to bimorph flaps 402B, 402C, and 402D. Such an example arrangement of switches may enable a self-test mode of operation having a 1:3 ratio, in which only bimorph flap 402A is electrically driven to vibrate at resonant frequency responsive to the electrical driving signal, and bimorph flaps 402B, 402C, and 402D collectively generate an electrical signal (e.g., as a sum of the voltages between the middle and top/bottom electrodes of each bimorph flap) responsive to detecting the vibration of bimorph flap 402A.

As another example arrangement, CPC 450 closes switches DA, DB, SC, and SD, and CPC 450 opens switches DC, DD, SA, and SB, such that an electrical driving signal may be provided by CPC 450 to bimorph flaps 402A and 402B only, without providing the same electrical driving signal to bimorph flaps 402C, and 402D. This arrangement of switches may enable a self-test mode of operation having a 1:1 ratio, in which half of the bimorph flaps (in this example, bimorph flaps 402A and 402B) are electrically driven to vibrate a particular frequency responsive to the electrical driving signal, and the other half of the bimorph flaps (in this example, 402C and 402D) collectively generate an electrical signal responsive to detecting the vibrations of bimorph flaps 402A and 402B.

In an example microphone operation, CPC 450 may close switches SA, SB, SC, and SD, and CPC 450 may open the remainder of switches DA, DB, DC, and DD. Under such a switch arrangement, all bimorph flaps 402A, 402B, 402C, and 402D may be configured to generate respective electrical response frequency signals by their vibrations responsive to pressure waves created by the surrounding environment. Such a microphone mode of operation may be considered a default mode of operation in certain applications.

Transmit circuit 430 may include any circuitry configured to receive electrical driving signals from CPC 450 and to provide the same to switch circuit 420. In some examples, transmit circuit 430 may include multiple transmit circuits, as described further with reference to transmit circuits 130A and 130B of FIG. 1B. Transmit circuit 430 may have one or more diodes that enable the transmission of electrical direct current in one direction only (e.g., from CPC 450 toward switch circuit 420). In an example speaker operation, CPC 450 may close switches DA, DB, DC, and DD to drive bimorph flaps 402A, 402B, 402C, and 402D.

Receive circuit 440 may include any circuitry configured to receive electrical response frequency signals from one or more of bimorph flaps 402A, 402B, 402C, or 402D (via switch circuit 420) and to provide the same to CPC 450. In some examples, receive circuit 440 may include multiple receive circuits, as described further with reference to transmit circuits 140A and 140B of FIG. 1B. Receive circuit 440 may have one or more diodes that enable the transmission of electrical direct current in one direction only (e.g., from switch circuit 420 toward CPC 450).

CPC 450 includes an analog-to-digital converter ("ADC") 451, a digital signal processor ("DSP") 452, a non-volatile memory ("NVM") 454 and a digital control 455. In some examples, CPC 450 may include or may be part of the CPC 152 of FIG. 1B, such that ADC 451, DSP 452, NVM 454 and digital control 455 are all subcomponents of CPC 152. In some examples, CPC 450 may also include a digital-to-analog converter ("DAC") not shown coupled between digital control 455 and transmit circuit 430.

ADC 451 may include any circuitry configured to convert analog electrical signals to digital electrical signals. ADC 451 is communicatively coupled to receive circuit 440 and digital control 455, such that ADC 451 may receive analog electrical response frequency signals from receive 440, convert the same to digital electrical signals, and provide the converted electrical signals to digital control circuit 455.

Digital control circuit 455 may include any circuitry configured to control the operation of certain other subcomponents of piezoelectric cantilever system 400. Digital control circuit is communicatively coupled at least to ADC 451, DSP 452, NVM 454, transmit circuit 430, and switch circuit 420. For example, through communicative coupling with switch circuit 420, digital control circuit 455 may be capable of providing control signals to control the opening and closing of switches DA, DB, DC, DD, SA, SB, SC, and SD. In addition, digital control circuit 455 provides electrical driving signals to switch circuit via transmit circuit 430. The electrical driving signals are provided to the appropriate bimorph flaps 402A, 402D, 402C, and 402D, responsive to the arrangement of switches DA, DB, DC, DD, SA, SB, SC, and SD within switch circuit 420, as controlled by digital control 455. In some examples, CPC 450 may include a DAC to convert digital signals generated by digital control 455 to analog electrical driving signals, and provide the analog electrical driving signals to transmit circuit 430.

DSP 452 may include any circuitry configured to perform one or more digital signal processing operations on data received from digital control 455 or NVM 454. For example, the digital signal processing may pertain to performing Fourier transform operations to determine a frequency response, and/or an equalization operation described herein. DSP 452 is communicatively coupled to at least digital control 455 and NVM 454. DSP 452 may provide equalized audio 453 as an output.

NVM 454 refers to any suitable computer memory that can persistently store data or program code. The program code may provide computer-readable instructions, that when executed, control the operation of one or more other components of CPC 450, such as digital control 455, ADC 451, or DSP 452. NVM 454 may be configured to store any suitable data. For example, the data stored by NVM 454 may be a digital representation of a response frequency signal received from piezoelectric cantilever system 410 via switch circuit 420, receive circuit 440, ADC 451, and digital control

455. In addition, the data stored by NVM 454 may be a response frequency spectrum stored as a digital representation of a collection of response frequency signals. As another example, the data stored by NVM 454 may be a digital representation of target response frequency spectrum that piezoelectric cantilever system 410 is designed to achieve under optimal conditions and performance.

Figure 5:
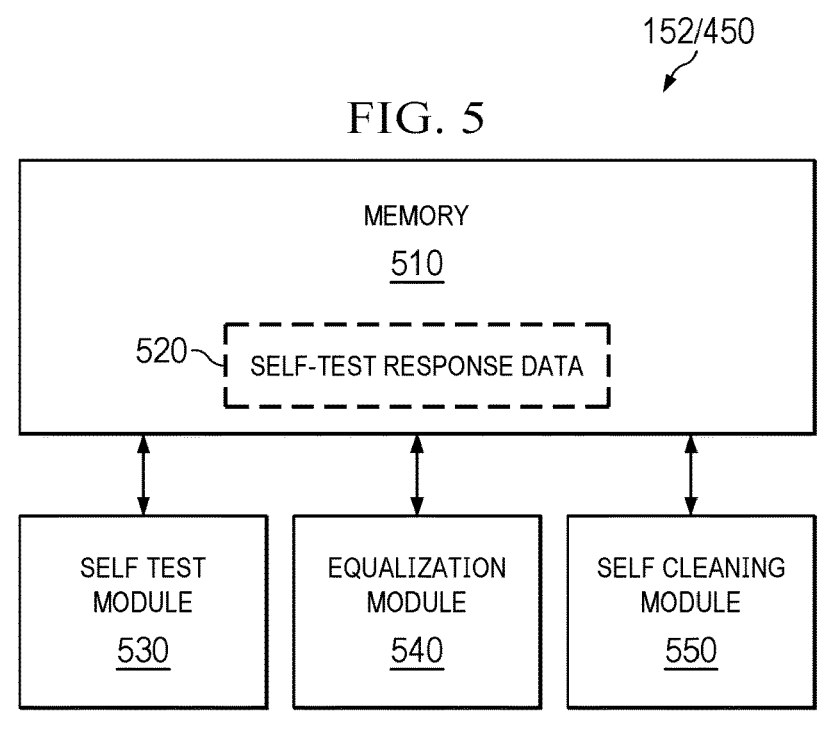
FIG. 5 is a schematic illustrating example subcomponents of the piezoelectric audio devices of FIG. 1 and FIG. 4.

FIG. 5 is a block diagram of various subcomponents that may be included within CPC 152 of FIG. 1A and CPC 450 of FIG. 4. In this example, the CPC includes a memory 510 storing self-test response data 520, a self-test module 530, an equalization module 540, and a self-cleaning module 550.

Memory 510 may include any suitable non-volatile computer memory that can persistently store data or program code. In some examples, memory 510 may be part of NVM 454 of FIG. 4. The data stored by memory 510 includes at least self-test response data 520. As explained with reference to FIG. 4, for example, certain self-test response data 520 stored in memory 510 may have been received from piezoelectric cantilever system 110/410 via switch circuit 420, receive circuit 440, ADC 451, and digital control 455. In some examples, memory 510 may also store program code to support self-test, equalization, and self-cleaning operations.

Self-test module 530 may include a circuit module configured to control piezoelectric cantilever system 110 perform one or more self-test operations quantifying one or more performance characteristics of the piezoelectric cantilever system. Self-test module 530 may also include program codes (stored in memory 510) that when executed causes the CPC and the piezoelectric cantilever system to perform the one or more self-test operations. As explained with reference to FIGS. 3-4, for example, certain self-test mode operations may involve the CPC providing an electrical driving signal (via transmit circuits) to a first subset of one or more bimorph flaps (e.g., including at least bimorph flap 102A, 402A, etc.). The first subset of bimorph flaps may vibrate responsive to the first electrical driving signal. A second subset of one or more bimorph flaps (e.g., including at least bimorph flap 102B, 402B, etc.) may be configured to vibrate responsive to sound waves created by the electrically-driven vibration of the first subset of bimorph flaps. The mechanically-driven vibration of the second subset of bimorph flaps generates a second electrical signal. In some examples, the CPC can provide driving signals to the first subset of bimorph flaps at different frequencies, and the electrical signals generated by the second subset of bimorph flaps, representing the vibrations caused by the sound waves, can be processed by the CPC to generate a frequency response of the piezoelectric cantilever systems 110 (or 410).

The CPC can further determine one or more operational characteristics of the piezoelectric systems 110. For example, by comparing the amplitude/magnitude/frequency of the second electrical signal with the respective threshold amplitude/magnitude/frequency, the CPC can determine whether the second subset of bimorph flaps vibrate as expected in response to the sound waves generated by the first subset of bimorph flaps. If the amplitude/magnitude/frequency of the second electrical signal are below the respective thresholds, the CPC may determine that the second subset of bimorph flaps fail to vibrate.

Also, by comparing the frequency response characteristics such as lower cut-off frequencies, resonant frequencies, quality factor (Q-factor), etc., from the measured frequency response of the piezoelectric cantilever system 110 and their target values (stored in memory 510), a determination may be made on whether the processed data indicates that piezoelectric cantilever system 110 is operating within expected specifications or, alternatively, may indicate one or more possible failure conditions. Example failure conditions that may be indicated include: the bimorph flaps not vibrating in response to the sound waves, the presence of moisture on one or more bimorph flaps (e.g., bimorph flaps 102A and 102B), the presence of moisture in within a back volume 195 separated from opening 106 by one or more bimorph flaps (e.g., bimorph flaps 102A and 102B), or the gap/slit 118 distance between the first and second bimorphs exceeding a limit.

The CPC may perform an action responsive to detecting the failure conditions. For example, in a case where the failure is not correctable (e.g., bimorph flaps not vibrating, the gap/slit 118 distance exceeding a limit, etc.) the CPC may provide a signal indicating the failure conditions, disable the receive circuit (or the entire audio device), etc. In a case where the failure is correctable (e.g., presence of moisture or other foreign objects), the CPC may trigger the self-cleaning module 550 to start a self-cleaning operation to correct the failure, as to be described below.

The CPC may be configured to execute self-test module 530 throughout the lifetime of piezoelectric cantilever system 110. For example, self-module 530 may be executed as part of an initialization process each time piezoelectric cantilever system 110 is utilized or powered on. The repeated execution of self-test module 530 may provide real-time awareness of certain operating conditions of piezoelectric cantilever system 110, which may provide an early warning that a self-cleaning module 550 should be executed, or that there may be a need to update equalization data stored in memory 510 and used by equalization module 540. Such cooperative operation of modules 530, 540, and 550 may improve reliability, longevity, and operational fidelity of piezoelectric cantilever system 110.

Equalization module 540 may include a circuit module configured to perform one or more self-equalization operations for piezoelectric cantilever system 110. Equation module 540 may also contain program codes (stored in memory 510) that when executed causes the CPC to perform one or more self-equalization operations for piezoelectric cantilever system 110. In some applications, it may be desirable to minimize any sensitivity variation of a given piezoelectric cantilever system 110 across its operational frequency range. Certain digital signal processing performed (e.g., by DSP 452) when executing equalization module 540 may be used to cancel out known sensitivity variation across an operational frequency range. Such digital signal processing may improve the ability of piezoelectric microphone 110 to sense all relevant frequencies of an operational range with the same or substantially similar weight, which may improve the ability of piezoelectric cantilever system 110 to record an acoustical input (as a microphone) or to provide an acoustic output (as a speaker) with high fidelity.

The equalization module 540 may access self-test response data 520 from memory 510. Self-test response data 520 may be generated by self-test module 530 while piezoelectric cantilever system 110 was operating in a self-test mode. The CPC may use the accessed data in applying certain digital signal processing (e.g., using DSP 452). As described above, during the self-test operation, self-test module 530 can sweep the frequency at which the first subset of the bimorph flaps are driven, and voltages output by a second subset of the piezoelectric bimorphs can be sampled and converted to digital values. Self-test response data 520 can contain a set of digital values mapped to different frequencies. The digital signal processing may include determining, based on the digital values, the sensitivity of piezoelectric microphone 110 at different frequencies. The sensitivity can be a ratio between a voltage output by the second subset of bimorph flaps and a pre-determined pressure value caused by the sound waves generated by the first subset of bimorph flaps (e.g., based on the amplitude of the sound waves, the back volume space, etc.).

The digital signal processing may also include determining various frequency response characteristics, such as the lower cut-off frequency and the resonant frequency, of the piezoelectric microphone 110 based on the sensitivities. For example, the equalization module 540 can determine the sensitivity of the piezoelectric microphone 110 at a particular frequency (e.g., 1 kHz) as a nominal value, and normalize the sensitivities at other frequencies with respect to the nominal value. The equalization module 540 can determine the lower cut-off frequency as the frequency at which the sensitivity starts to roll off from 0 dB (the nominal value), the resonant frequency as the frequency at which the sensitivity peaks, the Q-factor as the frequency range where the sensitivity experiences a 3 dB reduction from the peak sensitivity, etc. The equalization module 540 can also determine equalization coefficients that can be used to combine with the digital samples received from the piezoelectric cantilever system 110 when operating in the microphone mode, or to generate processed audio signals for transmit circuit 430 when operating in the speaker mode, to correct for the sensitivity variation with frequency.

Specifically, the equalization coefficients can provide an increased amplification gain at frequencies close to the lower cut-off frequency, and provide a decreased amplification gain at frequencies close to the resonant frequency, to provide a uniform sensitivity across a frequency range (e.g., the audible frequency range). During the microphone operation, the equalization module 540 can perform transform operations (e.g., Fourier transform) to convert the digital samples from time domain to frequency domain, apply the frequency-dependent equalization coefficients to the digital samples in the frequency domain, and convert the digital samples from the frequency domain back to the time domain to generate equalized audio signals. Also, during the speaker operation, the equalization module 540 can also perform transform operations (e.g., Fourier transform) to convert digital audio signals from time domain to frequency domain, apply the frequency-dependent equalization coefficients to the digital audio signals in the frequency domain, and convert the digital audio signals from the frequency domain back to the time domain to generate equalized digital audio signals. The DAC can then convert the equalized digital audio signals to electrical driving signals from transmit circuit 430.

Figure 6:
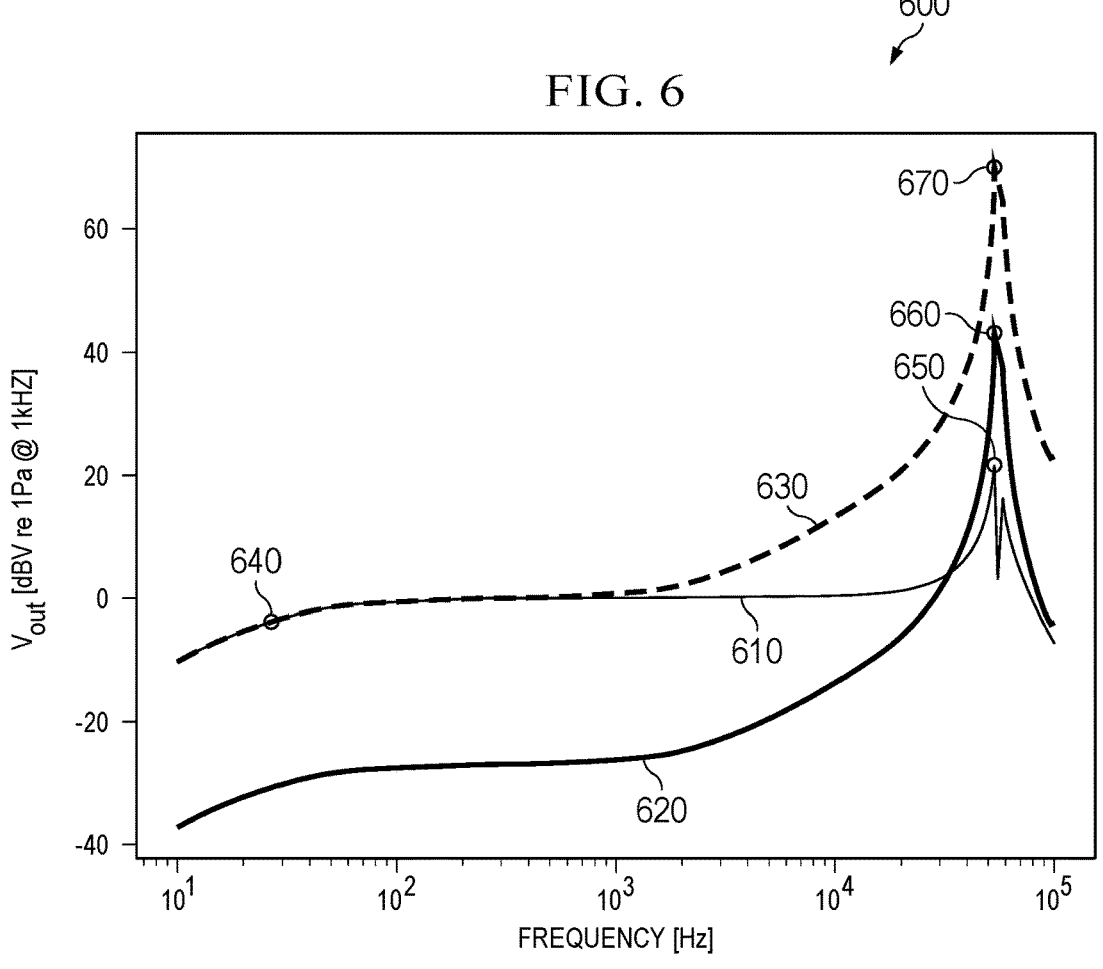
FIG. 6 is a graph illustrating example response frequency spectrums of electrical signals provided by the piezoelectric audio devices of FIG. 1 and FIG. 4.

FIG. 6 is a graph 600 plotting example response spectrums 610, 620, and 630 of piezoelectric cantilever system 110 to illustrate the equalization operations performed by the equalization module. Each response spectrum represents a relationship between a voltage (in dBV) provided by piezoelectric cantilever system 110 responsive to sound waves and a frequency of the sound waves. The sound waves exert a particular pressure (e.g., 1 Pa) on the piezoelectric bimorphs, and the response (in terms of voltage/pressure) can represent a sensitivity of the piezoelectric cantilever system. Response spectrum 610 represents an actual frequency response of piezoelectric cantilever system 110 when operating in the microphone mode, in which all bimorph flaps vibrate responsive to the sound waves, and the voltage output by the piezoelectric cantilever system can be a sum of the voltages output by each bimorph flap responsive to the vibration. Response spectrum 610 can represent a relationship between the sensitivity (based on a sum of voltage output by the bimorphs) and the frequency of the sound waves detected by the microphone. Also, response spectrum 620 represents a measured frequency response of piezoelectric cantilever system 110 when operating in the self-test mode, where the CPC transmit driving signals to vibrate a first subset (e.g., a first half) of the piezoelectric bimorphs to generate sound waves, and a second subset (e.g., a second half) of the piezoelectric bimorphs vibrate responsive to the sound waves and generate electrical signals responsive to the stress caused by the vibration. Response spectrum 620 can represent a relationship between the sensitivity of the second subset of the piezoelectric bimorphs (based on a sum of voltages output by the subset of bimorphs) and a frequency of the sound waves generated in the self-test mode.

Further, response spectrum 630 represents a normalized version of response spectrum 620, where the measured sensitivities at different frequencies is normalized to the measured sensitivity at a particular frequency, such as at 1 kHz. Due to the normalization, response spectrum 630 can align/overlap with response spectrum 610 over certain frequency range, such as at a low frequency range close to the lower cut off frequency. As shown in FIG. 6, the measured response spectrum 630 has similar cut off frequency (e.g., 30 Hz, marked by label 640) as the actual response spectrum 610. Also, the measured response spectrum 630 has similar peak/resonant frequency (e.g., 60 kHz, marked by labels 650, 660, and 670) as the actual response spectrum 610. However, the measured response spectrum 630 has a reduced quality (Q) factor compared with the actual response spectrum 610, so that the measured response spectrum 630 has a wider response peak than the actual response spectrum 610.

As described above, it may be desirable to minimize any sensitivity variation of a given piezoelectric cantilever system 110 across its operational frequency range. A desired/target frequency response of the piezoelectric cantilever system 110 may include a uniform sensitivity (e.g., 0 dBV re 1 Pa) across a significant portion of human audible frequency range (e.g., about 20 Hz to 20 kHz). Accordingly, to provide uniform sensitivity, the equalization module 540 can determine a set of equalization coefficients and scale the sampled signals with the equalization coefficients. Specifically, the equalization coefficients can provide an increased amplification gain at frequencies close to the lower cut-off frequency, and provide a decreased amplification gain at frequencies close to the resonant frequency. As explained above, the measured response spectrum 630 can provide accurate representation of the lower cut-off frequency and the resonant frequency of piezoelectric cantilever system 110. Accordingly, the equalization module 540 can determine the lower cut-off frequency and the resonant frequency of piezoelectric cantilever system 110 from the measured response spectrum 630, and determine the equalization coefficients accordingly. For example, from the measured response spectrum 630, the equalization module 540 can determine the frequency at label 640 (e.g., 30 Hz) as the lower cutoff frequency, based on a reduction of sensitivity at that frequency versus the nominal sensitivity (0 dBV) of 3 dB. The equalization module 540 can also determine the frequency at label 670 (e.g., 60 kHz) as the resonant frequency based on the sensitivity peaking at that frequency.

In addition, self-test module 530 can determine the Q-factor of piezoelectric cantilever system 110 from the measured response spectrum 630 and compare that with a reference Q-factor, and determine whether there is a reduction in the measured Q-factor. A reduction of the measured Q-factor relative to the reference Q-factor may indicate any of a number of negative operating conditions for piezoelectric cantilever system 110. For example, the presence of moisture or particles may cause an increase in air friction between bimorphs flaps (e.g., at airgap slit 104) that may be detected by a measured reduction in the Q-factor.

Also, the lower cut-off frequency and resonant frequency obtained through certain self-test operations may provide insight as to certain operational conditions and physical status of the piezoelectric cantilever system 110 being measured. For example, a measured resonant frequency that deviates significantly from a reference resonant frequency may indicate the presence of moisture or other unintended matter on one or more bimorph flaps (e.g., bimorph flaps 102A and 102B) of the piezoelectric cantilever system 110 under test, the presence of moisture between a back volume (e.g., back volume 195) and the bimorph flaps (e.g., bimorph flaps 102A and 102B) of the piezoelectric cantilever system 110 under test, the mechanical integrity of the back volume itself, a gap distance between bimorph flaps (e.g., bimorph flaps 102A and 102B) exceeding a limit, etc.

Referring back to FIG. 5, self-cleaning module 550 may include a circuit module configured to control piezoelectric cantilever system 110 to perform one or more self-cleaning operations. Self-cleaning module 550 may also include program codes (stored in memory 510) that when executed causes the CPC to perform the one or more self-cleaning operations. Self-test module 530 may trigger the self-cleaning module 550 to start the self-cleaning responsive to detection of foreign object (e.g., moisture) based on, for example, detection of a large deviation of the resonant frequency, lower cut-off frequency, etc., as described above. Self-cleaning module 550 may perform the self-cleaning operations by, for example, driving the bimorph flaps of piezoelectric cantilever system 110 (including bimorph flaps 102A and 102B) at a resonant frequency of the bimorph flaps (determined by self-test module 530) to maximize/increase the amplitude of vibration to dislodge the particles/moistures, and to minimize/reduce the amount of driving power, which can improve the efficiency of the self-cleaning operation. Self-cleaning module 550 may also enable heater 194 to heat and evaporate any moisture present in the back volume space 192 and/or in the front volume space, as described above.

Figure 7:
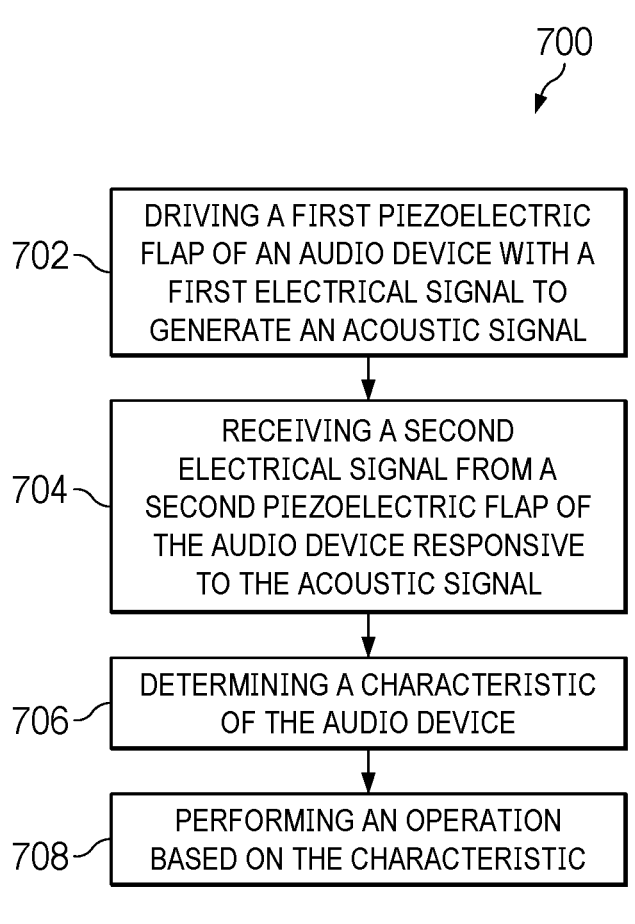
FIG. 7 is a flowchart of an example method of operating a piezoelectric audio device.

FIG. 7 illustrates a flowchart of an example method 700 of operating a piezoelectric audio device, such as audio device 100, which includes a piezoelectric cantilever system, such as piezoelectric cantilever systems 110, 410, or other cantilever systems to be described below. Method 700 can be performed by, for example, CPC 152/450 in conjunction with the piezoelectric cantilever system. Method 700 can be operated by audio device 100 configured as a microphone or as a speaker.

In operation 702, the CPC can drive a first piezoelectric flap (e.g., bimorph flap 102A, 402A) of the audio device via a transmit circuit (e.g., transmit circuits 130A, 430, etc.) with a first electrical signal to generate an acoustic signal/sound waves. The first electrical signal (and the acoustic signal) can be monotonic and have a particular frequency, or can be multi-tone and have a set of frequencies. The sound waves can propagate in via back volume space 192 to a second piezoelectric flap (e.g., (e.g., bimorph flap 102B, 402B) of the audio device. Some of the sound waves can also propagate directly from the first piezoelectric flap to the second piezoelectric flap via the back volume space.

In operation 704, the CPC can receive a second electrical signal from the second piezoelectric bimorph of the audio device responsive to the acoustic signal. The second piezoelectric bimorph can vibrate in response to the acoustic signal, and the vibration create stress. The second piezoelectric bimorph can generate the second electrical signal (e.g., a voltage between the middle electrode and top/bottom electrodes) representing the stress. The CPC can receive the second electrical signal via a receive circuit (e.g., receive circuits 140B, 440, etc.).

In operation 706, the CPC can determine a characteristic of the audio device based on the second electrical signal. The CPC can sample and digitize the second electrical signal, and determine the characteristic based on the digital samples.

In some examples, the characteristic can include a state of the piezoelectric cantilever system (e.g., whether some or all of the piezoelectric flaps under test fail to vibrate in response to the acoustic signal). For example, if the second electrical signal received by the CPC has a smaller amplitude (or magnitude) than a threshold, and/or if the frequency of the second electrical signal does not match the frequency of the first electrical signal (within a certain tolerance), the CPC may determine that at least some of the piezoelectric flaps under test fail.

In some examples, the characteristic can also include a frequency response of the piezoelectric cantilever system, from which the CPC can determine, for example, a relationship between the sensitivity of the piezoelectric cantilever system and frequency, the lower cut-off frequency, the resonant frequency, etc. As described above, the CPC can drive the first piezoelectric flap with a multi-tone driving signal, or drive the first piezoelectric flap with a mono-tone driving signal having different frequencies at different times. The CPC can process the digital samples of the second electrical signals and generate a response spectrum that maps the sensitivities to different frequencies, such as the response spectrum 630 illustrated in FIG. 6. The CPC may also determine the lower cut-off frequency, the resonant frequency, the Q-factor, etc., from the response spectrum.

In operation 710, the CPC can perform an action based on the characteristic. For example, in a case of detecting an uncorrectable failure (e.g., the piezoelectric flaps fail to vibrate, the gap/slit 118 becoming too large), the CPC may output a signal indicating failure, disable some or parts of the audio device to prevent the faulty piezoelectric cantilever system from generating audio signals, etc. Also, in a case of detecting a correctable failure, such as presence of foreign object, moisture, etc., the CPC may start the self-cleaning module 550 to start a self-cleaning operation (e.g., by driving the piezoelectric flaps at the resonant frequency) to remove the foreign object/moisture. Further, the CPC may determine a set of equalization coefficients based on identifying the lower cut-off frequency and resonant frequency, and the equalization module 540 can perform an equalization operation on future digital samples received from the piezoelectric cantilever system when operating in the microphone mode, or future audio signals to be output by the piezoelectric cantilever system when operating in the speaker mode, using the set of equalization coefficients.

Figure 8A:
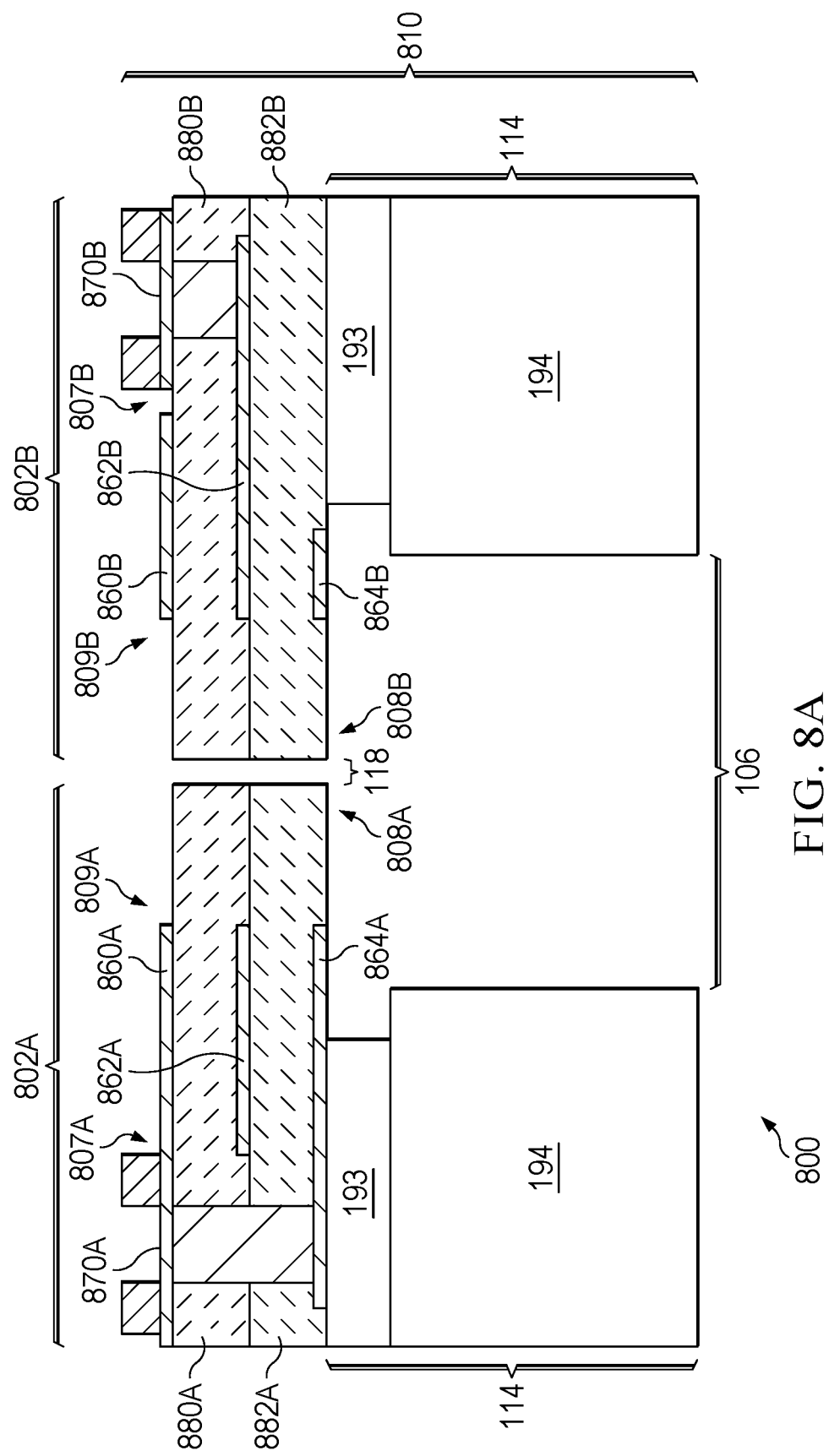
FIGS. 8A and 8B are schematics illustrating various views of an example piezoelectric cantilever system.
Figure 8B:
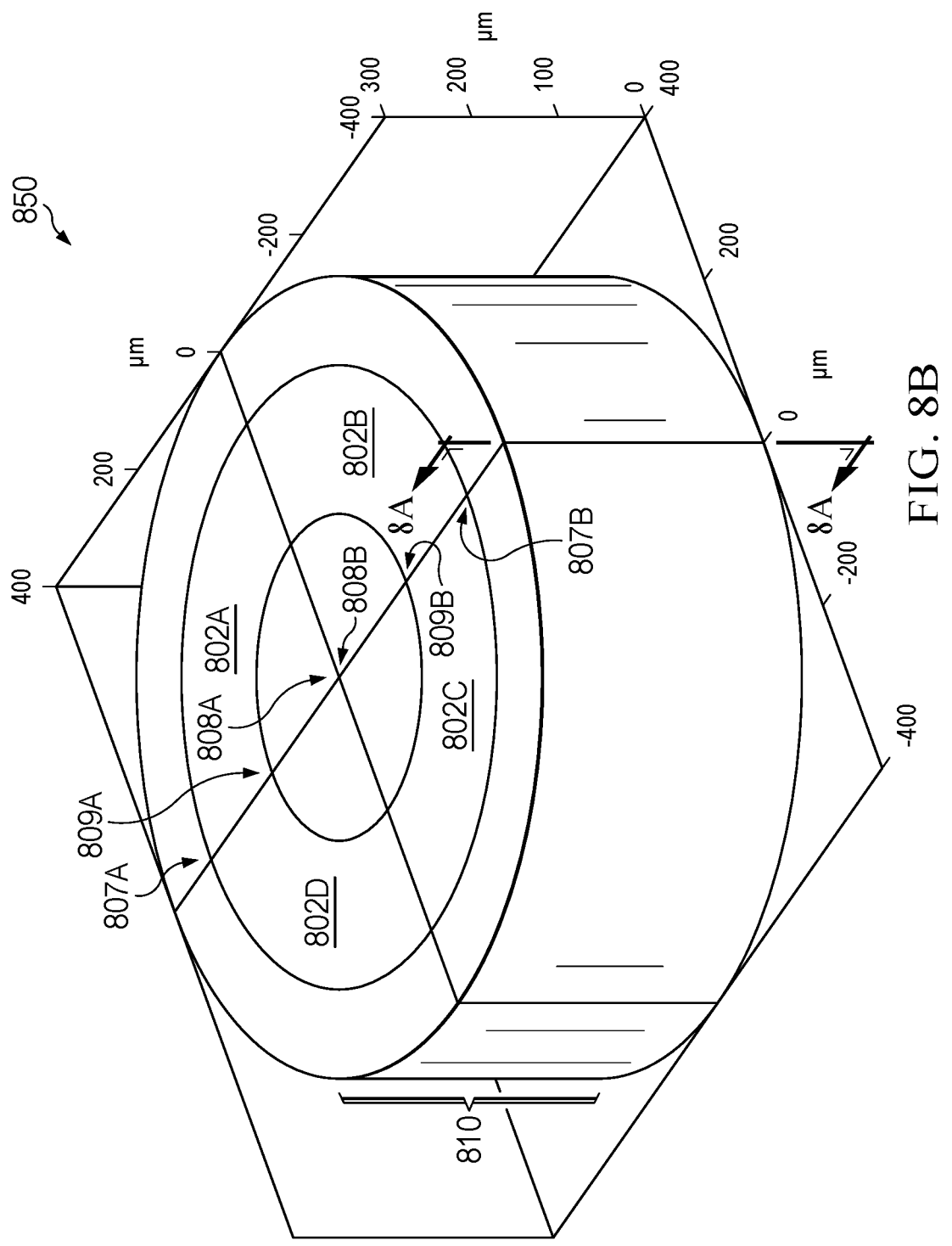

FIG. 8A shows a cross-sectional view 800 of an alternative piezoelectric system 810. In some examples, piezoelectric cantilever system 810 may be used in audio device 100 as piezoelectric cantilever systems 110/410. The illustrated cross-sectional view 800 of piezoelectric cantilever system 810 includes two bimorph flaps 802A-802B, with a gap/slit 118 separating bimorph flap 802A from adjacent bimorph flap 802B. Although the illustrated cross-sectional view 800 of piezoelectric cantilever system 810 shows two bimorph flaps 802A-802B, piezoelectric cantilever system 810 includes at least four bimorph flaps (as shown in FIG. 8B).

Bimorph flaps 802A and 802B are formed on structure 114. Substrate 114 has opening 106 formed therethrough, which permits pressure waves to be transmitted to or from bimorph flaps 802A and 802B through opening 106. Bimorph flaps 802A and 802B are both cantilevered, such that respective fixed portions are on structure 114 and respective moveable portions extend over respective portions of opening 106.

Each bimorph flap 802A-802B has a multi-layer structure. As shown in FIG. 8A, bimorph flap 802A has a top electrode 860A, a middle electrode 862A, and a bottom electrode 864A. At least a portion of middle electrode 862A is between top electrode 860A and bottom electrode 864A. Bimorph flap 802A also has first and second piezoelectric layers 880A and 882A. Piezoelectric layer 880A has at least a portion between top electrode 860A and middle electrode 862A. Piezoelectric layer 882A has at least a portion between middle electrode 162A and bottom electrode 864A. Top and bottom electrodes 860A and 864A are coupled to a terminal 870A. Middle electrode 862A is coupled to a another terminal (e.g., similar to terminal 170B of FIG. 1).

Bimorph flap 802B has a top electrode 860B, a middle electrode 862B, and a bottom electrode 864B. At least a portion of middle electrode 862B is between top electrode 860B and bottom electrode 864B. Bimorph flap 802B also has first and second piezoelectric layers 880B and 882B. Piezoelectric layer 880B has at least a portion between top electrode 860B and middle electrode 862B. Piezoelectric layer 882B has at least a portion between middle electrode 862B and bottom electrode 864B. Top and bottom electrodes 860B and 864B are coupled to a terminal 772B. Middle electrode 862B is coupled to a another terminal (e.g., similar to terminal 170B of FIG. 1).

In FIG. 8A, the length of electrodes 860A-B, 862A-B, and 864A-B only extends through a quarter to half of portion of the piezoelectric bimorph that suspends over opening 106. The exact ratio can be determined based on various factors, such as the material of the electrodes, the piezoelectric material, and the output energy (from the vibration). In some examples, the ratio can be chosen to maximize the output energy. As shown in FIG. 8A, the suspended portion of bimorph 802A has one end 807A on oxide 193 and an opposite end 808A over opening 806. At least one of top electrode 860A, a middle electrode 862A, or a bottom electrode 864A each extends, from end 807B, no more than half of the distance between ends 807A and 808A. Also, the suspended portion of bimorph 802B has one end 807B on oxide 193 and an opposite end 808B over opening 106. At least one of a top electrode 860B, a middle electrode 862B, or a bottom electrode 864B each extends no more than half the distance between ends 807B and 808B. The electrodes each extend between one quarter (¼) to one half (½) of the distance between ends 807A and 808A, and between ends 807B and 808B.

In piezoelectric cantilever system 810 of FIG. 8A, middle electrode 862A does not extend to end 808A and middle electrode 862B does not extend to end 808B. Under this example configuration, piezoelectric layers 880A and 882A are in direct contact with one another at end 808A; and piezoelectric layers 880B and 882B are in direct contact with one another at end 808B.

FIG. 8B shows a perspective view 850 of the piezoelectric cantilever system 810 shown in FIG. 8A. The different shading at end 807A relative to end 808A illustrates that the outermost top electrode 860A extends from end 807A to point 809A, which in this example is no more than half the distance between ends 807A and 808A. Similarly, the different shading at end 807B relative to end 808B illustrates that the outermost top electrode 860B extends from end 807B to point 809B, which in this example is no more than half the distance between ends 807B and 808B. The partial coverage of top electrodes 806A-806B leaves exposed an outward surface of piezoelectric layers 880A-880B or 882A-882B (e.g., along a surface extending from 809A to 809B). In this example, the lengths of the exposed surface piezoelectric layer surfaces (e.g., as measured between ends 808A and 809A, and between 808B and 809B) are more than half of the lengths of the suspend portions of the respective piezoelectric bimorph flaps.

Although FIG. 8B illustrates piezoelectric cantilever system 810 as having four bimorph flaps 802A, 802B, 802C, and 802D, piezoelectric cantilever system 810 may include fewer bimorph flaps (e.g., 2 or 3) or more bimorph flaps (e.g., 5, 6, 7, 8, 9, 10, 11, 12, or more). In addition, although FIG. 8B illustrates piezoelectric cantilever system 810 as having a cylindrical shape, piezoelectric cantilever system 810 may have any suitable shape (e.g., a three-dimensional extrusion of an ellipse, a square, a rectangle, a triangle, a trapezoid, some other polygon, etc.).

Piezoelectric cantilever system 810 may also have any suitable dimensions. For example, piezoelectric cantilever system 810 may have a maximum width (e.g., as measured from end 807A to 807B) of 500 microns to 1 mm and a maximum height of 250 microns to 0.5 mm, with the maximum height being, for example, no more than half the maximum width. In some examples, each airgap slit separating bimorph flaps 802A, 802B, 802C, and 802D from one another (e.g., gap/slit 118) may have a width within the range of 1 to 10 microns.

The arrangements of FIGS. 8A and 8B can reduce the overall mass/weight of each piezoelectric bimorph, which can facilitate the movement of the bimorph in response to sound wave and increase the overall sensitivity the audio device in detecting and converting sound waves into electrical signals. Specifically, during the movement of the bimorph, the stress (and the electric fields) at the ends 807A and 807B of the bimorphs are much higher than at ends 808A and 808B of the bimorphs. Accordingly, the electrodes at ends 807A and 807B can sense larger electric fields/stress per unit movement of the bimorphs, but the electrodes at ends 807B and 808B towards the center may sense a reduced electric field/stress and do not improve the overall sense outputs of the bimorphs. Meanwhile, by removing the electrodes at ends 807B and 808B, the mass/weight of the bimorphs can be reduced, which can improve the overall sensitivity of the audio device in converting between sound waves and electrical signals. In addition, the reduction in overall mass of bimorph flap can shift the resonant frequency (e.g., towards the audible frequency range) and reduce the residual stress that may also affect the sensitivity of the bimorph flaps.

Figure 9A:
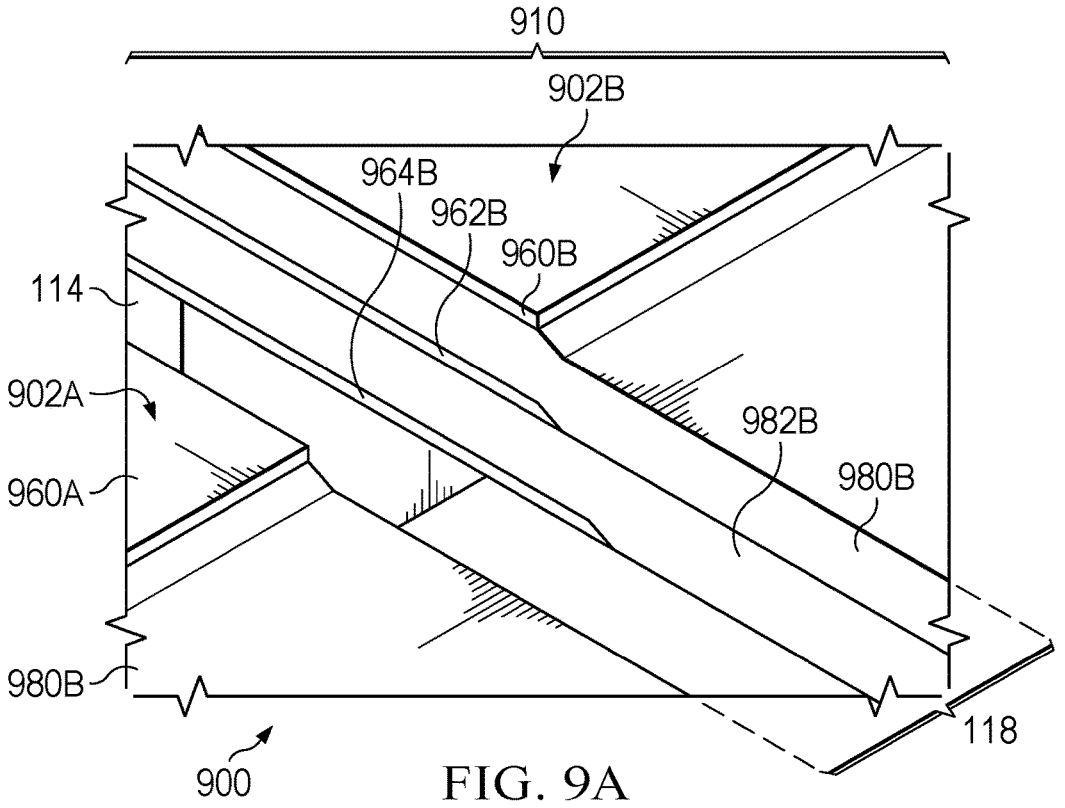
FIGS. 9A and 9B are schematics illustrating various views of an example piezoelectric bimorph that can be part of the piezoelectric cantilever system of FIGS. 8A and 8B.
Figure 9B:
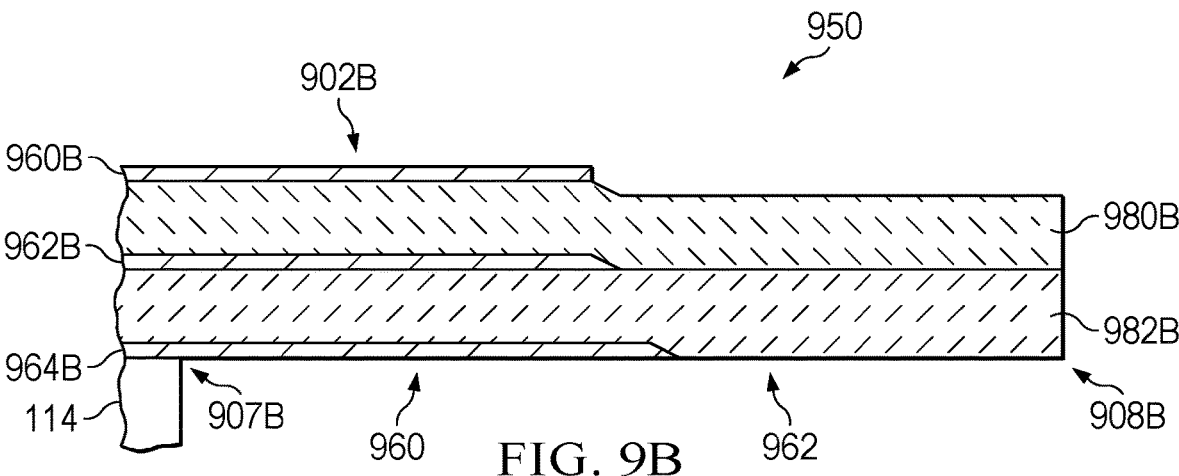

FIGS. 9A and 9B provide a perspective view 900 and a cross-sectional view 950, respectively, of a portion of piezoelectric cantilever system 910 having a plurality of bimorph flaps, including at least the bimorph flaps 902A and 902B illustrated in FIG. 9A, which are separated from one another by gap/slit 118. Cantilever system 910 can be an example of cantilever system 810 of FIGS. 8A and 8B.

Referring to FIGS. 9A and 9B, bimorph flap 902B has a top electrode 960B, a middle electrode 962B, and a bottom electrode 964B. At least a portion of middle electrode 962B is between top electrode 960B and bottom electrode 964B. Bimorph flap 902B also has first and second piezoelectric layers 980B and 982B. Piezoelectric layer 980B has at least a portion between top electrode 960B and middle electrode 962B. Piezoelectric layer 982B has at least a portion between middle electrode 962B and bottom electrode 964B. Further, at least part of bottom electrode 964B is embedded in piezoelectric layer 982B, where a surface 960 of bottom electrode 964B and a surface 962 of piezoelectric layer 982B are continuous and conformal with each other.

As shown in FIG. 9B, the suspended portion of bimorph flap 902B has one end 907B on structure 114 and another end 808B over an opening in the structure 114. The top, middle, and bottom electrodes (960B, 962B, and 964B) each extends from end 907B to no more than three-quarters the distance between ends 907B and 908B. A portion of middle electrode 962B is between piezoelectric layers 980B and 982B at end 907B. Middle electrode 962B does not fully extend from end 907B to end 908B, such that piezoelectric layers 980B and 982B are in direct contact with one another from end 908B to where middle electrode 962B ends.

In some examples, bimorph flap 902B may have a reduced overall thickness at end 908B relative to an overall thickness of bimorph flap 902B at end 907B, which may result in a reduced overall mass of bimorph flap 902B. As explained above, the reduction in the overall mass of bimorph flap 902B may provide certain technical advantages in some applications. For example, the reduction in overall mass of bimorph flap 902B may result in an increase in resonant frequency for bimorph flap 902B. In addition, the reduction in overall mass of bimorph flap 902B may mitigate against residual stresses impacting performance of bimorph flap 902B.

Figure 10B:
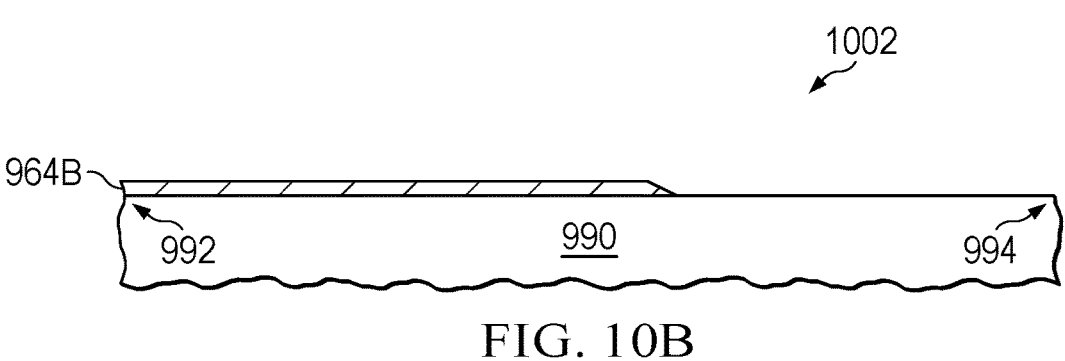
FIGS. 10B, 10C, 10D, 10E, 10F, and 10G are schematics illustrating various stages of fabricating the example piezoelectric bimorphs of FIGS. 9A and 9B.

FIG. 10A illustrates a flowchart of an example method 1000 of fabricating a piezoelectric cantilever system, such as piezoelectric cantilever system 910 of FIGS. 9A and 9B. Also, FIGS. 10B-10F illustrates the piezoelectric cantilever system in various stages of fabrication illustrated in FIG. 10A.

Referring to FIG. 10A and FIG. 10B, in operation 1002, a first electrode (e.g., bottom electrode 964B) is formed on an outward surface of a multi-layered substrate (e.g., substrate 990), which can include an oxide layer and a semiconductor (e.g., silicon) substrate. The bottom electrode extends over location 992 to location 994 of multi-layered substrate 990, where locations 992 and 994 can correspond to, respectively and as an example, ends 907B and 908B of the suspended portion of the piezoelectric bimorph flap 902B including the bottom electrode to be formed in subsequent operations. The bottom electrode can have a length between one-half and a quarter of the distance between locations 992 and 994. Part of the substrate 990 between locations 992 and 994 below the bottom electrode are to be removed in subsequent operations to form opening 106 and structure 114. The formation of the illustrated portion of bottom electrode 964B may be performed, for example, by a sputter deposition of a moly layer on substrate 990. The moly layer may then be patterned, etched, and cleaned to form the illustrated portion of bottom electrode 964B, where the bottom electrode 964B does not extend more than half of the distance between locations 992 and 994 (and ends 907B and 908B)

Figure 10C:
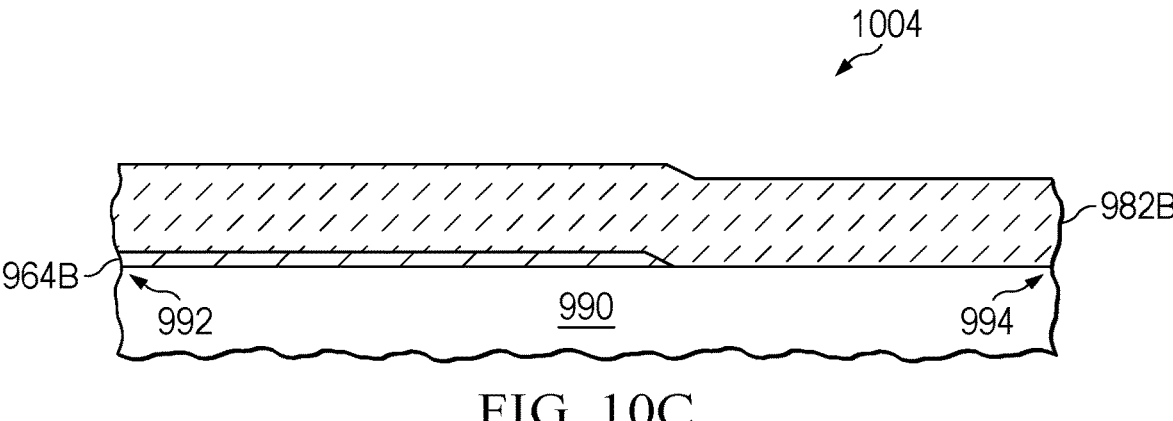

Referring to FIG. 10A and FIG. 10C, in operation 1004, a first piezoelectric layer (e.g., piezoelectric layer 982B) is formed on respective portions of bottom electrode 964B and substrate 990. The formation of the illustrated piezoelectric layer 982B may be performed, for example, by a sputter deposition of a layer of piezoelectric material, such as an AlN layer. The deposition of piezoelectric layer 982B may be substantially conformal to underlying layers, such that there may be a slight height difference in the portion of piezoelectric layer 982B over bottom electrode 864B relative to the portion of piezoelectric layer 982B in contact with substrate 890, and at least part of bottom electrode 964B can become embedded in the piezoelectric layer 982B.

Figure 10D:
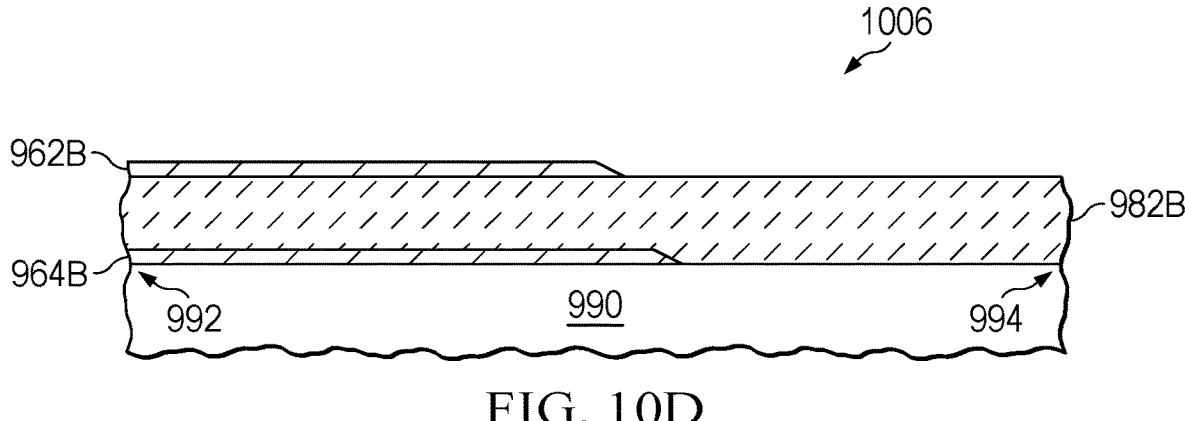

Referring to FIG. 10A and FIG. 10D, in operation 1006, a second electrode (e.g., middle electrode 862B) is formed on the first piezoelectric layer (e.g., piezoelectric layer 882B). The middle electrode also extends over location 992 to location 994 of multi-layered substrate 990, and the middle electrode can have a length between one-half and a quarter of the distance between locations 992 and 994 (and ends 907B and 908B). The formation of the illustrated portion of middle electrode 962B may be performed, for example, by a sputter deposition of a moly layer. The moly layer may then be patterned, etched, and cleaned to form the illustrated portion of middle electrode 962B, where the middle electrode 962B does not extend more than half of the distance between locations 992 and 994 (and ends 907B and 908B)

Figure 10E:
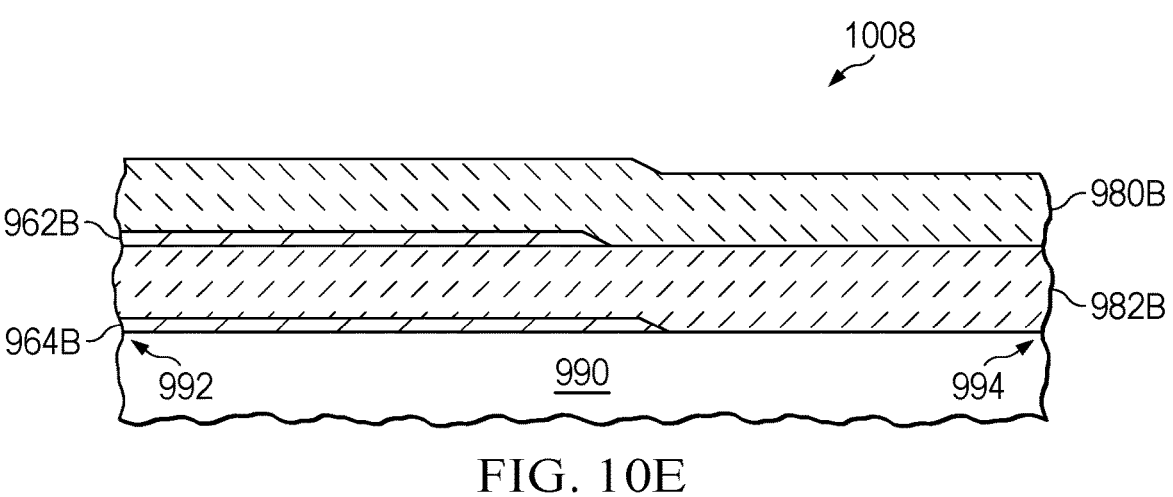

Referring to FIG. 10A and FIG. 10E, in operation 1008, a second piezoelectric layer (e.g., piezoelectric layer 980B) can be formed on respective portions of the second electrode (e.g., middle electrode 962B) and the first piezoelectric layer (e.g., piezoelectric layer 982B). The formation of the illustrated piezoelectric layer 980B may be performed, for example, by a sputter deposition of an AlN layer. The deposition of piezoelectric layer 980B may be substantially conformal to underlying layers, such that there may be a slight height difference in the portion of piezoelectric layer 980B over middle electrode 962B relative to the portion of piezoelectric layer 980B in contact piezoelectric layer 982B.

Figure 10F:
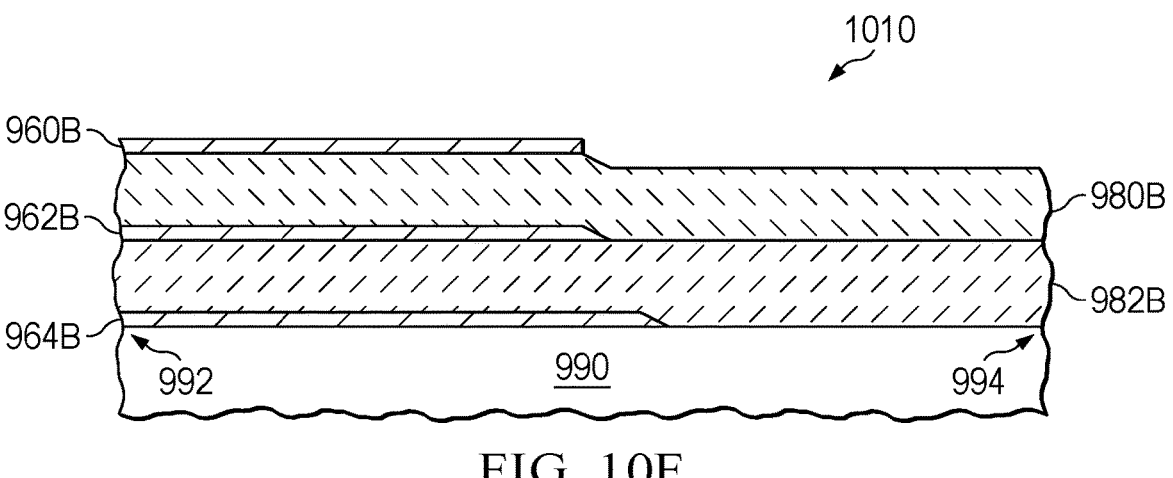

Referring to FIG. 10A and FIG. 10F, in operation 1010, a third electrode (e.g., top electrode 860B) is formed on the second piezoelectric layer (e.g., piezoelectric layer 980B). The top electrode also extends over location 992 to location 994 of multi-layered substrate 990, and the top electrode can have a length between one-half and a quarter of the distance between locations 992 and 994 (and ends 907B and 908B). The formation of the illustrated portion of top electrode 960B may be performed, for example, by a sputter deposition of a moly layer. The moly layer may then be patterned, etched, and cleaned to form the illustrated portion of top electrode 960B, where the top electrode 960B does not extend more than half of the distance between locations 992 and 994 (and ends 907B and 908B).

Figure 10G:
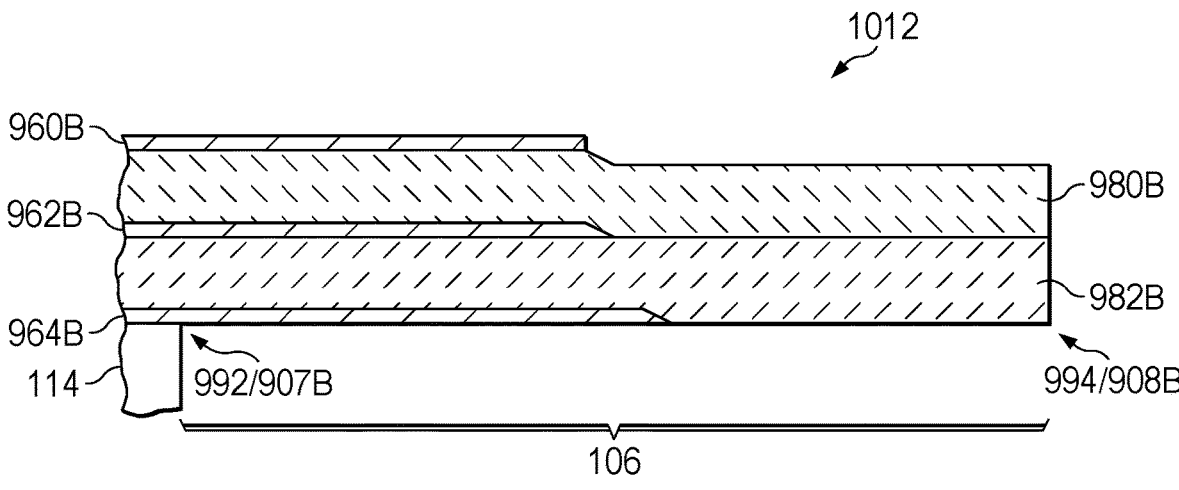

Referring to FIG. 10A and FIG. 10G, in operation 1012, a portion of substrate 990 between locations 992 and 994 can be removed to form structure 114 and opening 106. The removal of the portion of substrate 990 can be performed by, for example, a backside etch processing operation. Further, bimorph flap 902B may be separated by adjacent bimorph flaps (e.g., bimorph flap 902A) by etching completely through respective portions of at least piezoelectric layers 980B and 982B proximate to end 908B, thereby forming the gap/slit 118.

Figure 11A:
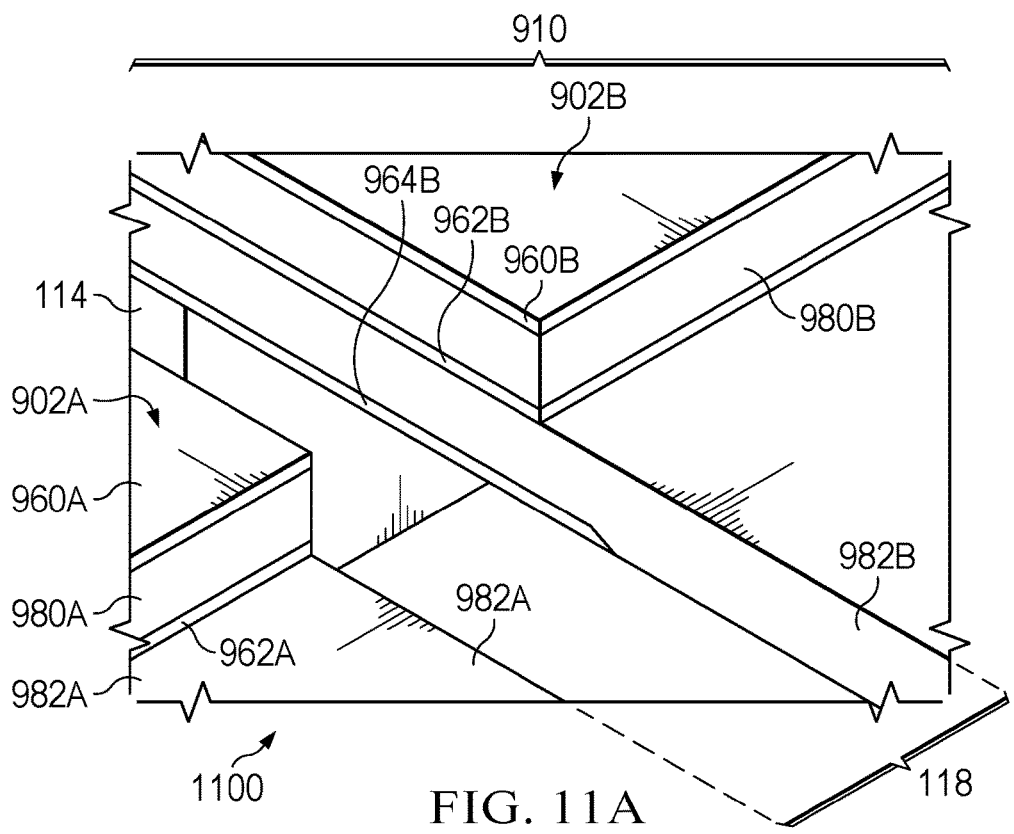
FIGS. 11A and 11B are schematics illustrating various views of an example piezoelectric bimorph that can be part of the piezoelectric cantilever system of FIGS. 9A and 9B.
Figure 11B:
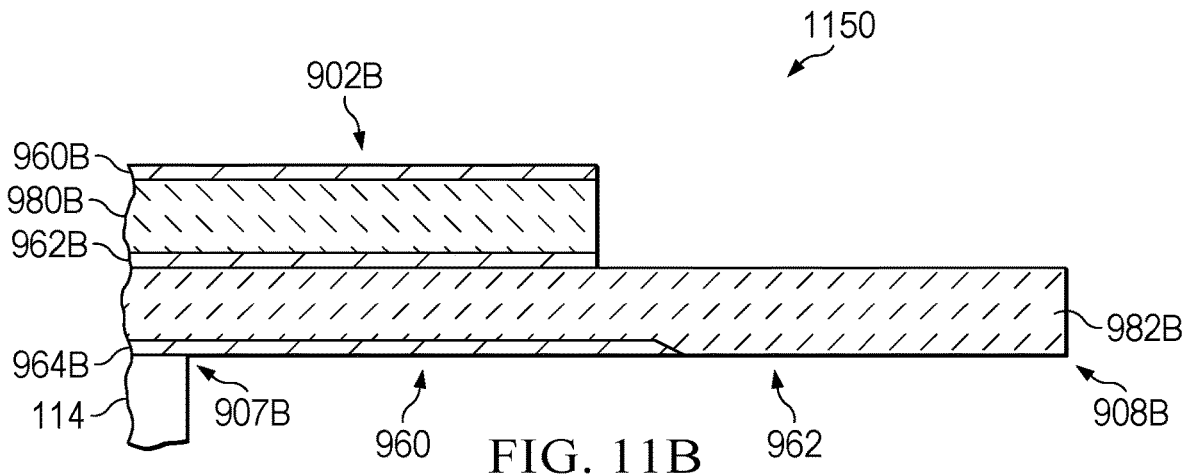

FIGS. 11A and 11B provide a perspective view 1100 and a cross-sectional view 1150, respectively, a portion of another example of the piezoelectric cantilever system 910. The example piezoelectric cantilever system 910 has similar arrangements of electrodes and piezoelectric layer 982B as the example piezoelectric cantilever system of FIGS. 9A and 9B, where top electrode 960B covers at least a portion of piezoelectric layer 980B. Piezoelectric layer 980B extends over no more than half of the distance between ends 907B and 908B, and middle electrode 962B covers at least a portion of piezoelectric layer 982B. The top and middle electrodes 960B and 962B extends no more than half of the distance from end 907B to end 908B. Piezoelectric layer 982B fully extends from end 907B to end 908B and thus has an exposed surface extending from where middle electrode 962B ends to end 908B.

The extension of top, middle, and bottom electrodes (960B, 962B, and 964B) from end 907B to no more than half the distance between ends 907B and 908B may result in a reduced overall mass of bimorph flap 902B (e.g., relative to an alternative bimorph flap in which top, middle, and bottom electrodes fully extend end-to-end). The overall mass of bimorph flap shown in 902B of FIG. 11B may be further reduced by removing a portion of piezoelectric layer 980B, as shown in FIG. 11B. The reduction in overall mass of bimorph flap 902B may result in an increase in the sensitivity of bimorph flap 902B. In addition, the reduction in overall mass of bimorph flap 902B may mitigate against residual stresses impacting performance of bimorph flap 802B.

Figure 12B:
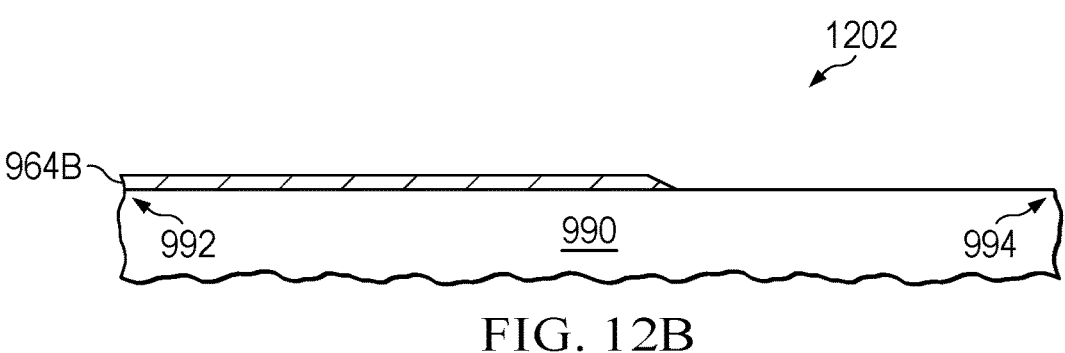
FIGS. 12B, 12C, 12D, 12E, 12F, 12G, 12H, and 12I are schematics illustrating various stages of fabricating the example piezoelectric bimorphs of FIGS. 11A and 11B.

FIG. 12A illustrates a flowchart of an example method 1200 of fabricating a piezoelectric cantilever system, such as piezoelectric cantilever system 910 of FIGS. 11A and 11B. Also, FIGS. 12B-12I illustrates the piezoelectric cantilever system in various stages of fabrication illustrated in FIG. 12A.

Referring to FIG. 12A and FIG. 12B, in operation 1202, a first electrode (e.g., bottom electrode 964B) is formed on an outward surface of a multi-layered substrate (e.g., substrate 990), which can include an oxide layer and a semiconductor (e.g., silicon) substrate. The bottom electrode extends over a location 992 to a location 994 of multi-layered substrate 990, where locations 992 and 994 can correspond to, respectively and as an example, ends 907B and 908B of the suspended portion of the piezoelectric bimorph flap 902B including the bottom electrode to be formed in subsequent operations. The bottom electrode can have a length between one-half and a quarter of the distance between locations 992 and 994. Part of the substrate 990 between locations 992 and 994 below the bottom electrode are to be removed in subsequent operations to form opening 106 and structure 114. The formation of the illustrated portion of bottom electrode 964B may be performed, for example, by a sputter deposition of a moly layer on substrate 990. The moly layer may then be patterned, etched, and cleaned to form the illustrated portion of bottom electrode 964B, where the bottom electrode 964B does not extend more than half of the distance between locations 992 and 994 (and ends 907B and 908B).

Figure 12C:
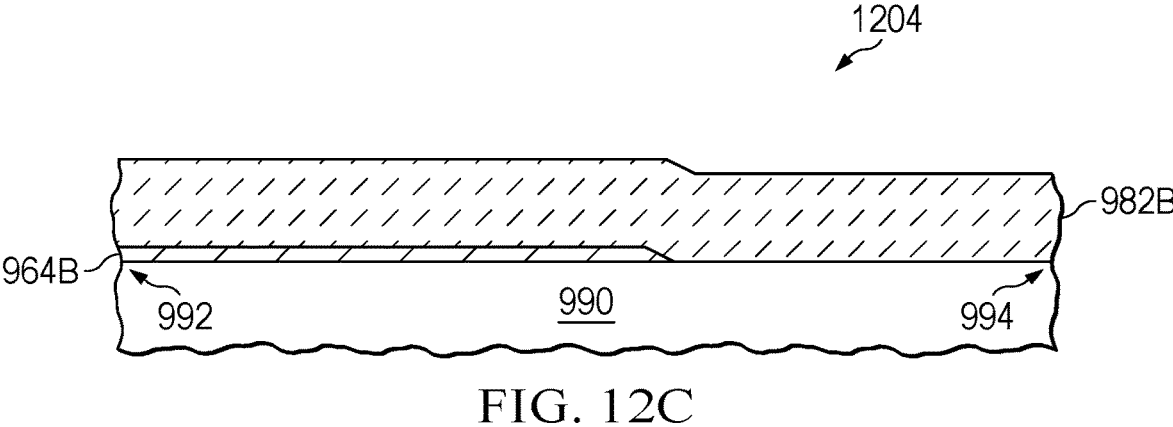

Referring to FIG. 12A and FIG. 12C, in operation 1204, a first piezoelectric layer (e.g., piezoelectric layer 982B) is formed on respective portions of bottom electrode 964B and substrate 990. The formation of the illustrated piezoelectric layer 982B may be performed, for example, by a sputter deposition of a layer of piezoelectric material, such as an AlN layer. The deposition of piezoelectric layer 982B may be substantially conformal to underlying layers, such that there may be a slight height difference in the portion of piezoelectric layer 982B over bottom electrode 964B relative to the portion of piezoelectric layer 982B in contact with substrate 890, and at least part of bottom electrode 964B can become embedded in the piezoelectric layer 982B.

Figure 12D:
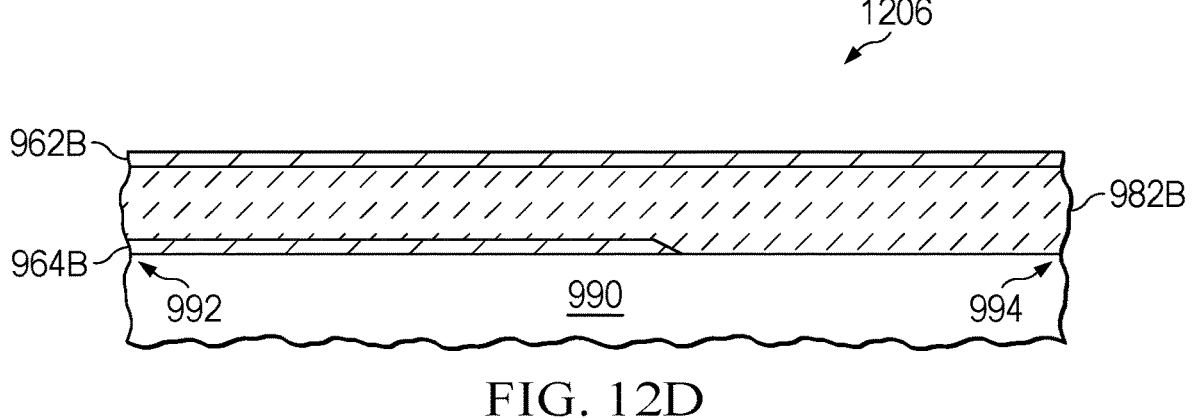

Referring to FIG. 12A and FIG. 12D, in operation 1206, a second electrode (e.g., middle electrode 862B) is formed on the first piezoelectric layer (e.g., piezoelectric layer 882B). The middle electrode also extends over location 992 to location 994 of multi-layered substrate 990. In FIG. 12D, the middle electrode can extend over the entire length between locations 992 and 994 (and ends 907B and 908B). The formation of the illustrated portion of middle electrode 962B may be performed, for example, by a sputter deposition of a moly layer.

Figure 12E:
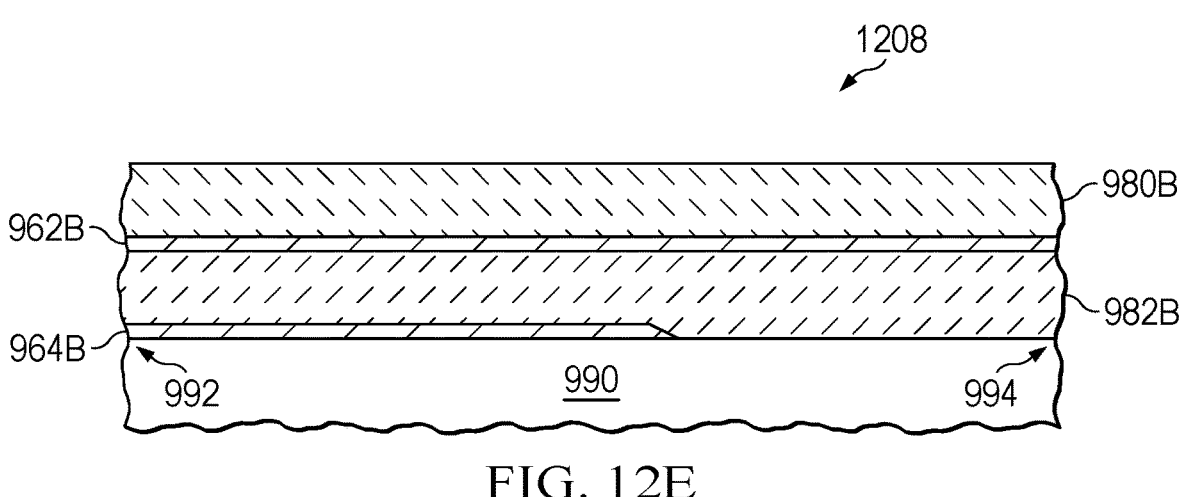

Referring to FIG. 12A and FIG. 12E, in operation 1208, a second piezoelectric layer (e.g., piezoelectric layer 980B) can be formed on the second electrode (e.g., middle electrode 962B). in The formation of the illustrated piezoelectric layer 980B may be performed, for example, by a sputter deposition of an AlN layer.

Figure 12F:
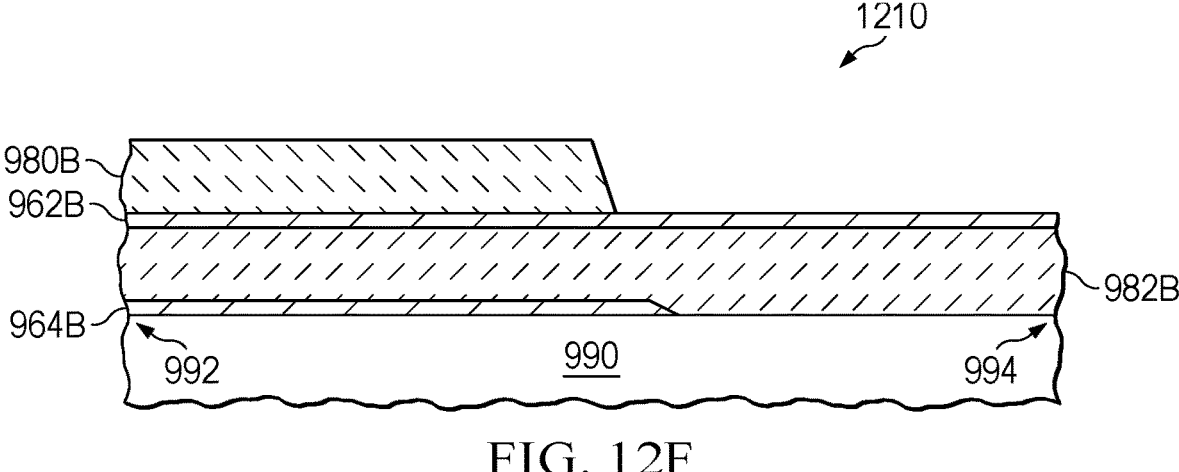

Referring to FIG. 12A and FIG. 12F, in operation 1210, a portion of the second piezoelectric layer (e.g., piezoelectric layer 980B) on the second electrode (e.g., middle electrode 962B) is removed, and a portion of the underlying middle electrode 962B is exposed. The selective removal of the portion of piezoelectric layer 980B may be performed, for example, by one or more pattern, etch, and clean processes. Half (or more) of the piezoelectric layer 980B between locations 992 and 994 can be removed.

Figure 12G:
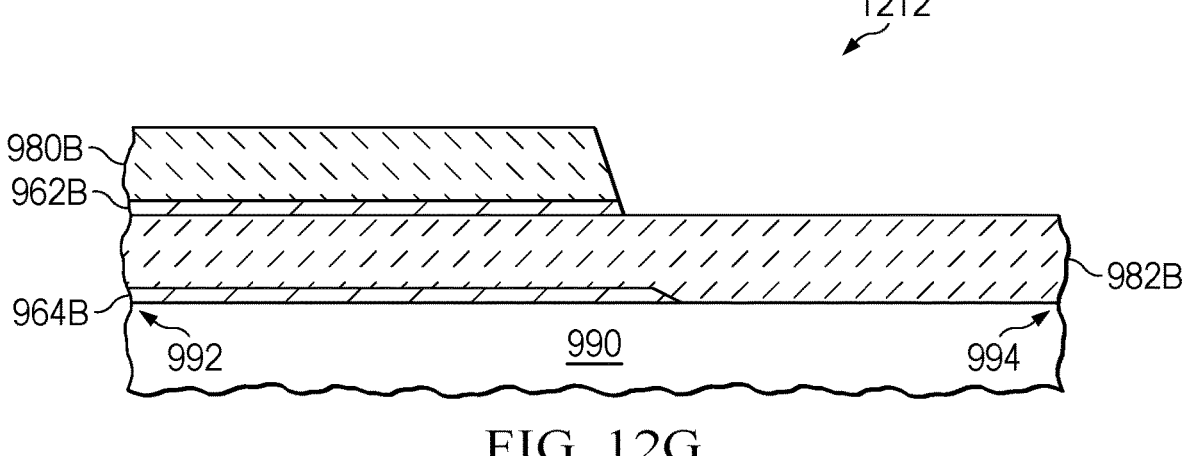

Referring to FIG. 12A and FIG. 12G, in operation 1212, the exposed portion of the second electrode (e.g., the middle electrode 962B) is removed. The selective removal of a portion of middle electrode 962B may be performed, for example, by one or more pattern, etch, and clean processes. After the selective removal of the portion of middle electrode 962B, the remaining portion of the middle electrode 962B extends no more than half of the distance between locations 992 and 994 (and ends 907B and 908B).

Figure 12H:
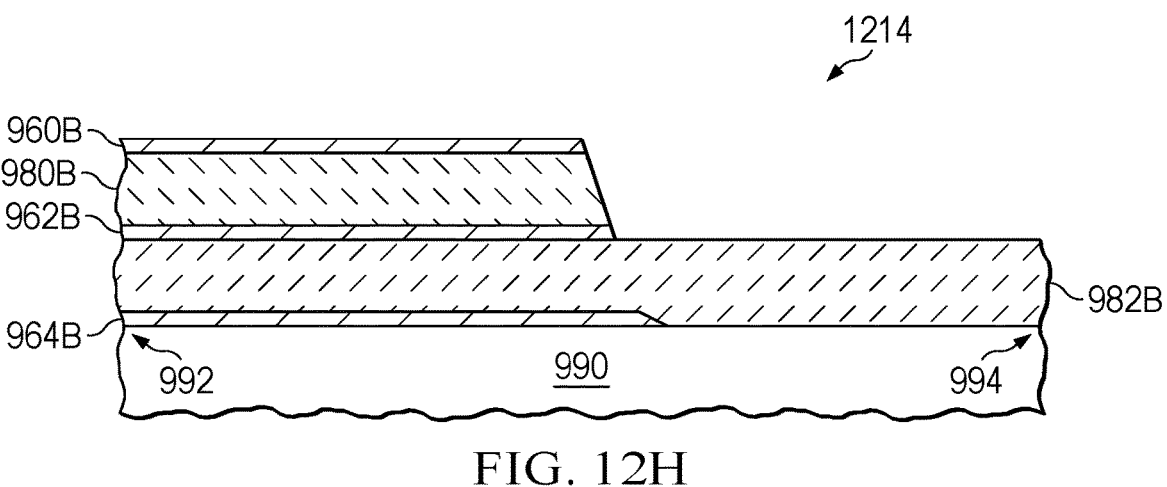

Referring to FIG. 12A and FIG. 12H, in operation 1214, a third electrode (e.g., top electrode 960B) is formed on the remaining second piezoelectric layer (e.g., piezoelectric layer 980B). The top electrode also extends over location 992 to location 994 of multi-layered substrate 990, and the top electrode can have a length between one-half and a quarter of the distance between locations 992 and 994 (and ends 907B and 908B). The formation of the illustrated portion of top electrode 960B may be performed, for example, by a sputter deposition of a moly layer. The moly layer may then be patterned, etched, and cleaned to form the illustrated portion of top electrode 960B, where the top electrode 960B does not extend more than half of the distance between locations 992 and 994 (and ends 907B and 908B).

Figure 12I:
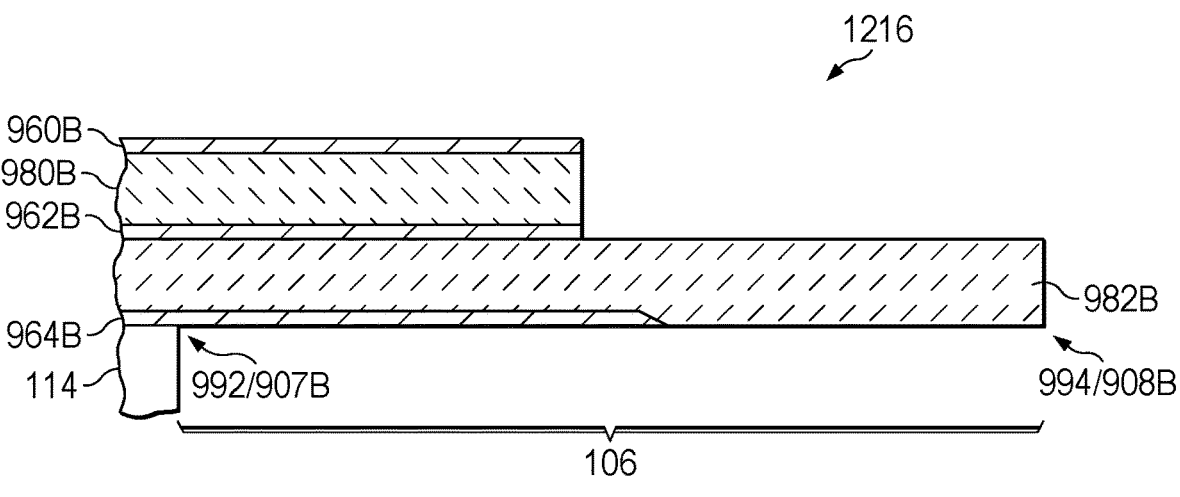

Referring to FIG. 12A and FIG. 12I, in operation 1216, a portion of substrate 990 can be removed between locations 992 and 994 to form structure 114 and opening 106. The removal of the portion of substrate 990 can be performed by, for example, a backside etch processing operation. Further, bimorph flap 902B may be separated by adjacent bimorph flaps (e.g., bimorph flap 902A) by etching completely through respective portions of at least piezoelectric layers 980B and 982B proximate to end 908B, thereby forming the gap/slit 118.

Figure 13A:
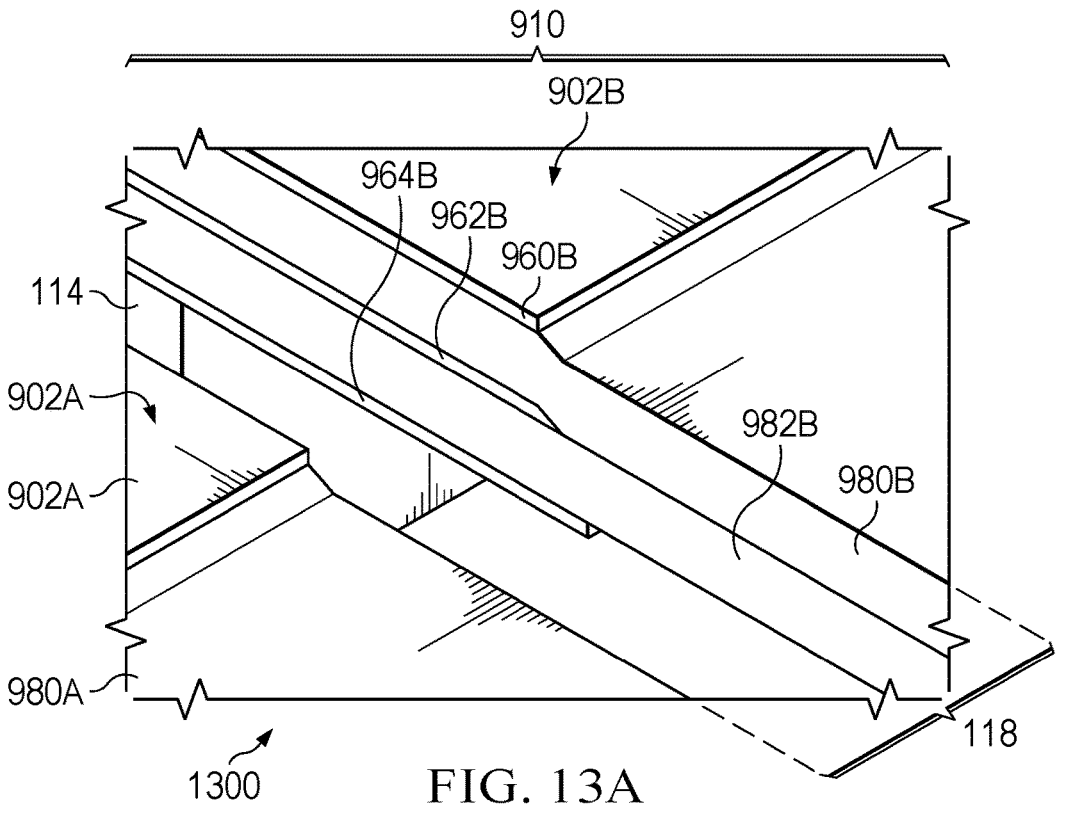
FIGS. 13A and 13B are schematics illustrating various views of another example piezoelectric bimorph that can be part of the piezoelectric cantilever system of FIGS. 9A and 9B.
Figure 13B:
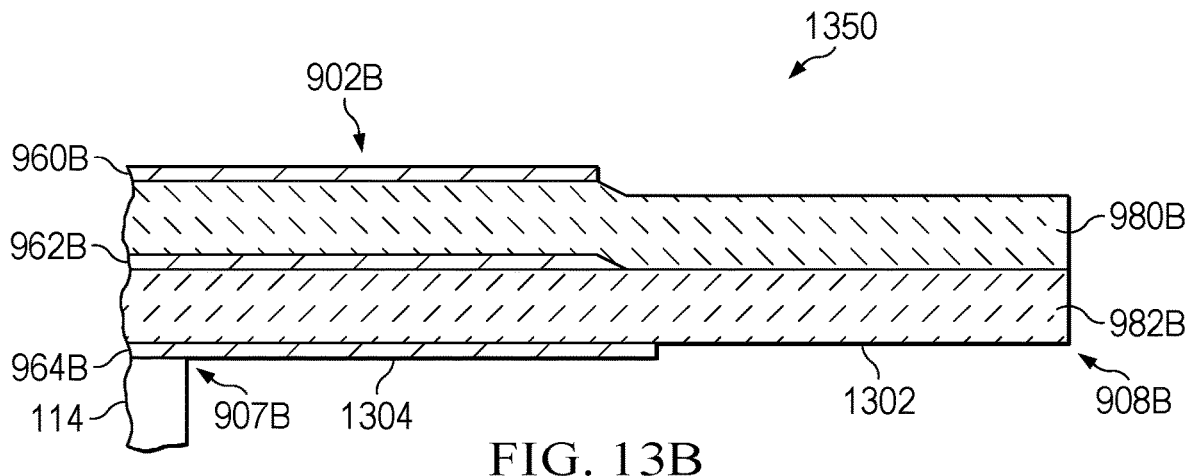
Figure 14A:
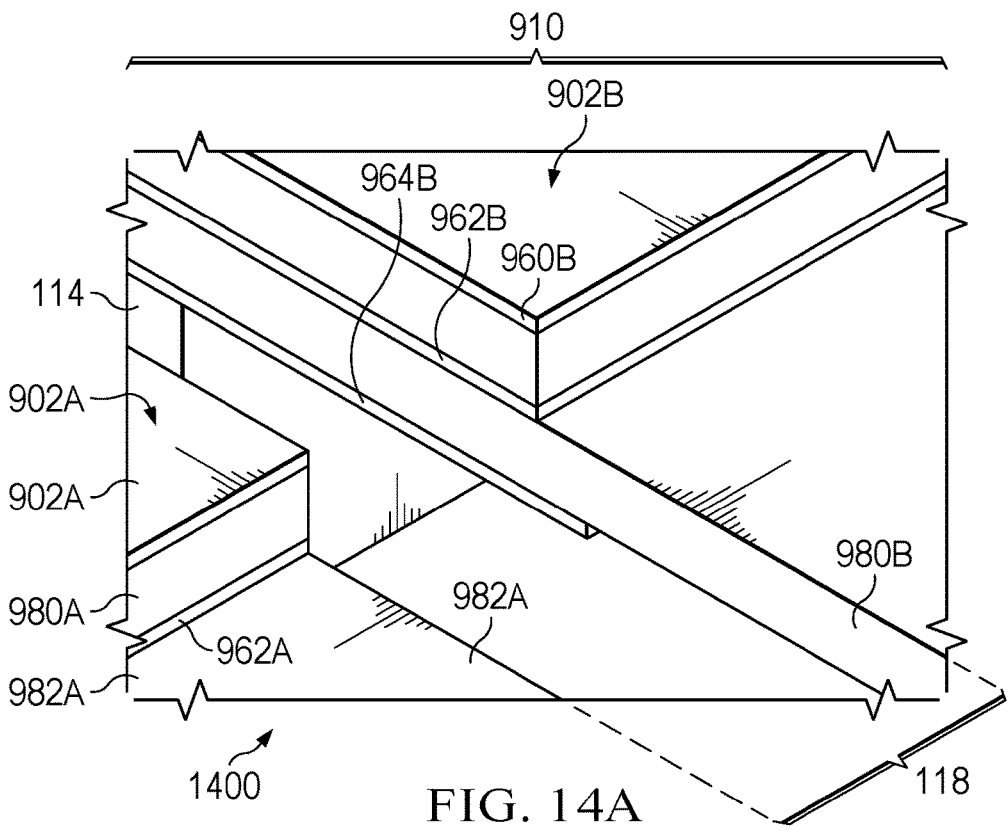
FIGS. 14A and 14B are schematics illustrating various views of another example piezoelectric bimorph that can be part of the piezoelectric cantilever system of FIGS. 9A and 9B.
Figure 14B:
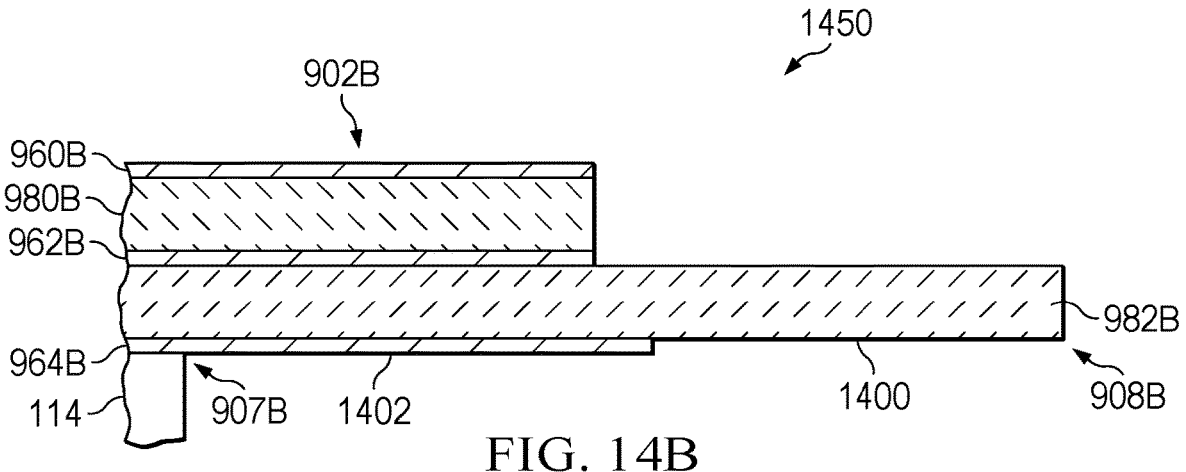

FIGS. 13A and 13B provide a perspective view 1300 and a cross-sectional view 1350, respectively, of a portion of another example of the piezoelectric cantilever system 910. Also, FIGS. 14A and 14B provide a perspective view 1400 and a cross-sectional view 1450, respectively, of a portion of another example of the piezoelectric cantilever system 910. The example piezoelectric cantilever system 910 in FIG. 13A and FIG. 13B has similar arrangements of electrodes and piezoelectric layers as the example piezoelectric cantilever system 910 in FIG. 9A and FIG. 9B, but with bottom electrode 964B formed on a surface 1302 of piezoelectric layer 982B instead of being embedded in piezoelectric layer 982B, so that a surface 1304 of bottom electrode 964B and the surface 1302 of piezoelectric layer 982B form discontinuous surfaces. Also, the example piezoelectric cantilever system 910 in FIG. 14A and FIG. 14B has similar arrangements of electrodes and piezoelectric layers as the example piezoelectric cantilever system 910 in FIG. 11A and FIG. 11B, but with bottom electrode 964B formed on a surface 1400 of piezoelectric layer 982B instead of being embedded in piezoelectric layer 982B, so that a surface 1402 of bottom electrode 964B and the surface 1400 of piezoelectric layer 982B form discontinuous surfaces. The arrangements in FIGS. 13A, 13B, 14A, and 14B and reduce the discontinuity in piezoelectric layer 982B, which can improve the reliability of the piezoelectric bimorph.

Figure 15B:
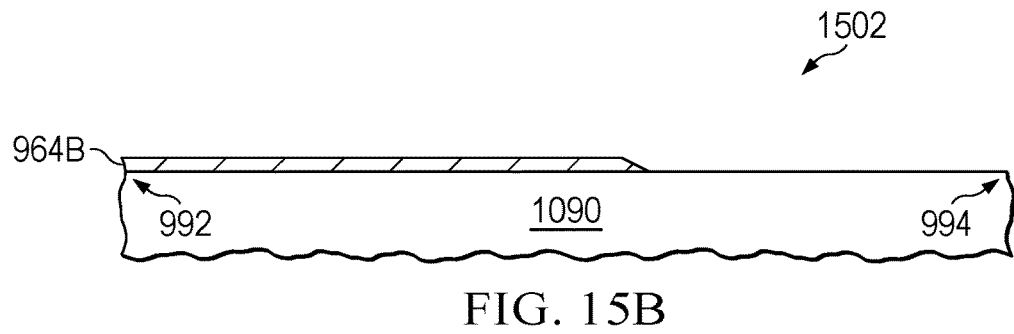
FIGS. 15B, 15C, 15D, and 15E are schematics illustrating various stages of fabricating the example piezoelectric bimorphs of FIGS. 13A-14B in FIG. 15A.

FIG. 15A illustrates a flowchart of an example method 1500 of fabricating a piezoelectric cantilever system, such as piezoelectric cantilever system 910 of FIGS. 13A, 13B, 14A, and 14B. Also, FIGS. 15B-15F illustrates the piezoelectric cantilever system in various stages of fabrication illustrated in FIG. 15A.

Referring to FIG. 15A and FIG. 15B, in operation 1502, a first electrode (e.g., bottom electrode 964B) is formed on an outward surface of a multi-layered substrate (e.g., substrate 990), which can include an oxide layer and a semiconductor (e.g., silicon) substrate. The bottom electrode extends over a location 992 to a location 994 of multi-layered substrate 990, where locations 992 and 994 can correspond to, respectively and as an example, ends 907B and 908B of the suspended portion of the piezoelectric bimorph flap 902B including the bottom electrode to be formed in subsequent operations. The bottom electrode can have a length between one-half and a quarter of the distance between locations 992 and 994. Part of the substrate 990 between locations 992 and 994 below the bottom electrode are to be removed in subsequent operations to form opening 106 and structure 114. The formation of the illustrated portion of bottom electrode 964B may be performed, for example, by a sputter deposition of a moly layer on substrate 990. The moly layer may then be patterned, etched, and cleaned to form the illustrated portion of bottom electrode 964B, where the bottom electrode 964B does not extend more than half of the distance between locations 992 and 994 (and ends 907B and 908B).

Figure 15C:
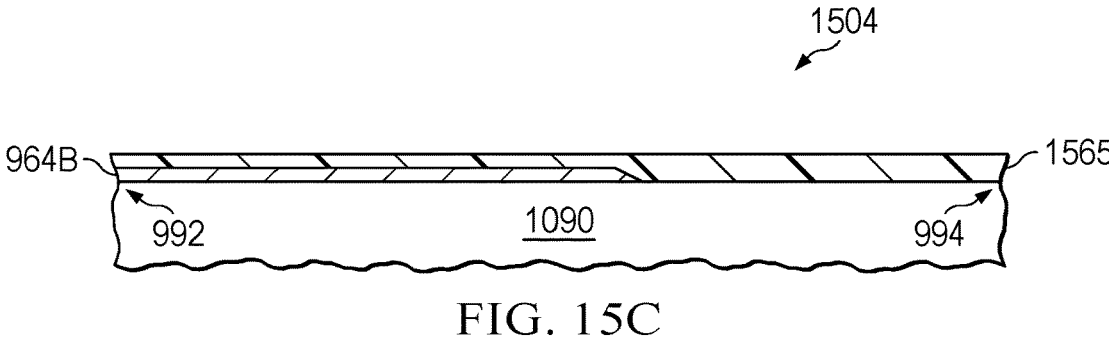

Referring to FIG. 15A and FIG. 15C, in operation 1504, a sacrificial layer (e.g., sacrificial layer 1565) is formed on respective portions of the first electrode (e.g., bottom electrode 964B) and substrate 990. The formation of the illustrated sacrificial layer 1065B may be performed, for example, by a sputter deposition of an oxide layer.

Figure 15D:
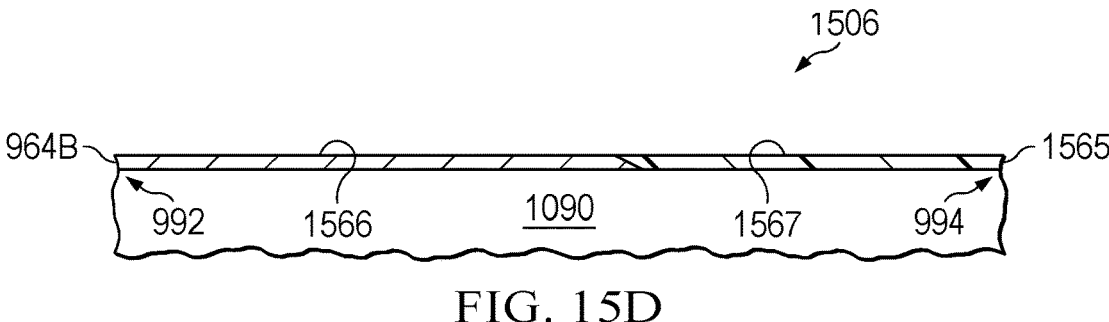

Referring to FIG. 15A and FIG. 15D, in operation 1506, at least some of the sacrificial layer 1565 and/or bottom electrode 964B can be removed to expose bottom electrode 964B. In some examples, the sacrificial layer 1565 and/or bottom electrode 964B can be subject to a polish operation, such as a chemical and mechanical polish (CMP) operation. As a result of the polish operation, bottom electrode 964B can be exposed, the remaining portion of the sacrificial layer 1565 abuts the bottom electrode 964B, and an outward surface 1566 of bottom electrode 964B and an outward surface 1567 of sacrificial layer 1065B are substantially coplanar (or at least continuous).

Figure 15E:
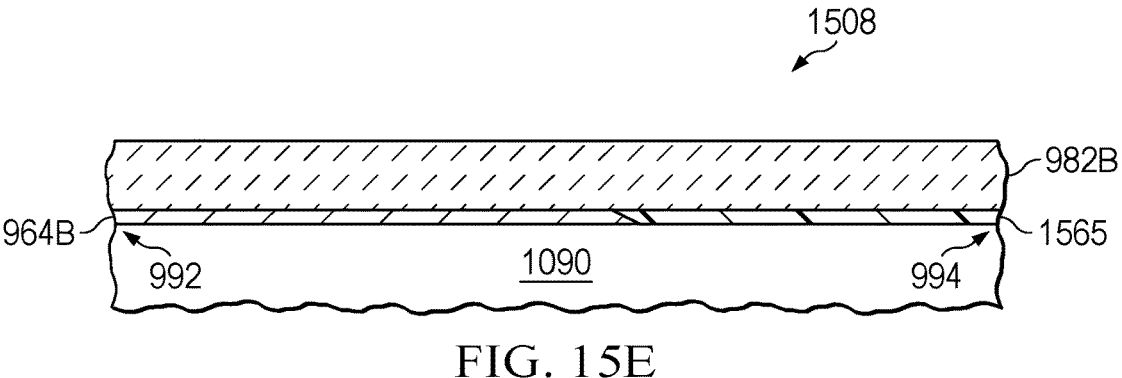

Referring to FIG. 15A and FIG. 15E, in operation 1508, a first piezoelectric layer (e.g., piezoelectric layer 982B) can be formed on the exposed portion of bottom electrode 964B and on sacrificial layer 1565. Due to the planarization previously performed on underlying layers, piezoelectric layer 982B may have a substantially planar outward surface. This may improve the quality of processing steps for each layer subsequently formed on piezoelectric layer 982B.

Operation 1508 can be followed by, for example, operations 1006-1012 of method 1000 or operations 1206-1216 of method 1200 to form the middle and top electrodes 960 and 962, the piezoelectric layer 980, and structure 114 and opening 106. The remaining portion of the sacrificial layer 1565 can also be removed (e.g., by etching) prior to or after operations 1006-1012 or operations 1206-1216.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context. To aid the Patent Office, and any readers of any patent issued on this application, in interpreting the claims appended hereto, applicant notes that there is no intention that any of the appended claims invoke paragraph 6 of 35 U.S.C. § 112 as it exists on the date of filing hereof unless the words "means for" or "step for" are explicitly used in the claim language.

In the foregoing descriptions, for purposes of explanation, numerous specific details are set forth to provide a thorough understanding of one or more examples. However, this disclosure may be practiced without some or all these specific details, as will be evident to one having ordinary skill in the art. In other instances, well-known process steps or structures have not been described in detail in order not to unnecessarily obscure this disclosure. In addition, while the disclosure is described in conjunction with example examples, this description is not intended to limit the disclosure to the described examples. To the contrary, the description is intended to cover alternatives, modifications, and equivalents as may be included within the spirit and scope of the disclosure as defined by the appended claims.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements may be external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An audio device comprising:
a substrate having an opening;
a first piezoelectric flap having a first end on the substrate and extending over a first part of the opening, the first piezoelectric flap having first and second terminals;
a second piezoelectric flap having a second end on the substrate and extending over a second part of the opening, the second piezoelectric flap spaced from the first piezoelectric flap, the second piezoelectric flap having third and fourth terminals;

a transmit circuit having driver outputs;

a first receive circuit having first receiver inputs;

a switch circuit having first switch terminals and second switch terminals, the first switch terminals coupled to the driver outputs and the first receiver inputs, and the second switch terminals coupled to the first and second terminals; and a second receive circuit having second receiver inputs coupled to the third and fourth terminals.

2. The audio device of claim 1, wherein the transmit circuit is a first transmit circuit, the driver outputs are first driver outputs, and the switch circuit is a first switch circuit, the audio device further comprising:

a second transmit circuit having second driver outputs; and a second switch circuit having third switch terminals and fourth switch terminals, the third switch terminals coupled to the second driver outputs and the second receiver inputs, and the fourth switch terminals coupled to the third and fourth terminals.

3. The audio device of claim 2, further comprising a control circuit coupled to the first and second transmit circuits and the first and second receive circuits, the control circuit configured to, in a first mode:

provide a first driving signal to the first piezoelectric flap via the first transmit circuit and the first switch circuit, in which the first piezoelectric flap is configured to vibrate at a first resonant frequency responsive to the first driving signal; and provide a second driving signal to the second piezoelectric flap via the second transmit circuit and the second switch circuit, in which the second piezoelectric flap is configured to vibrate at a second resonant frequency responsive to the second driving signal.

4. The audio device of claim 3, wherein the control circuit is configured to, in a second mode:

receive a first signal representing detection of an audio signal from the first piezoelectric flap via the first receive circuit and the first switch circuit; and provide a second signal representing the detection of the audio signal from the second piezoelectric flap via the second receive circuit and the second switch circuit.

5. The audio device of claim 1, further comprising a control circuit coupled to the transmit circuit and the first and second receive circuits, the control circuit configured to:

provide a driving signal through the transmit circuit and the switch circuit to the first and second terminals, in which the first piezoelectric flap is configured to vibrate responsive to the driving signal;

receive a response signal from the second receive circuit representing a vibration of the second piezoelectric flap responsive to the vibration of the first piezoelectric flap;

generate a response frequency spectrum based on the response signal; and store data representing the response frequency spectrum in a memory.

6. The audio device of claim 5, wherein the control circuit is further configured to:

determine one or more measured frequency response characteristics from the response frequency spectrum;

compare the one or more measured frequency response characteristics with one or more target frequency response characteristics; and provide a status indication based on a result of the comparison.

7. The audio device of claim 6, wherein the one or more measured frequency response characteristics include: a resonant frequency, a lower cut-off frequency, or a quality factor.

8. The audio device of claim 6, wherein the control circuit is configured to provide the status indication of at least one of: presence of foreign objects on the first and second piezoelectric flaps, presence of foreign objects in a back volume space of the audio device, or a gap distance between the first and second piezoelectric flaps exceeding a threshold.

9. The audio device of claim 8, wherein the driving signal is a first driving signal, and the control circuit is configured to provide a second driving signal through the transmit circuit and the switch circuit to the first and second terminals responsive to the status indication of presence of foreign objects on the first and second piezoelectric flaps.

10. The audio device of claim 8, wherein the foreign objects include moisture, the audio device further comprising a heater interfacing the back volume space, and the control circuit is configured to enable the heater responsive to at least one of: the status indication of presence of moisture on the first and second piezoelectric flaps, or the status indication of presence of moisture in the back volume space.

11. The audio device of claim 6, wherein the control circuit is configured to:

determine equalization coefficients based on the data; and perform an equalization operation based on the equalization coefficients.

12. The audio device of claim 11, wherein the control circuit is configured to determine a resonant frequency and a lower cut-off frequency based on the data, sensitivities of the second piezoelectric flap at the resonant frequency and the lower cut-off frequency based on the data, and determine the equalization coefficients based on the resonant frequency, the lower cut-off frequency, and the sensitivities.

13. The audio device of claim 1, wherein:

the first piezoelectric flap includes:

a first top electrode;

a first bottom electrode;

a first middle electrode having at least a portion between the first bottom electrode and the first top electrode;

a first piezoelectric layer having at least a portion between the first top electrode and the first middle electrode; and a second piezoelectric layer having at least a portion between the first middle electrode and the first bottom electrode, the first top and bottom electrodes coupled to the first terminal, and the first middle electrode coupled to the second terminal; and the second piezoelectric flap includes:

a second top electrode;

a second bottom electrode;

a second middle electrode having at least a portion between the second top electrode and the second bottom electrode;

a third piezoelectric layer having at least a portion between the second top electrode and the second middle electrode; and a fourth piezoelectric layer having at least a portion between the second middle electrode and the second bottom electrode, the second top and bottom electrodes coupled to the third terminal, and the second middle electrode coupled to the fourth terminal.

14. The audio device of claim 13, wherein:

the first piezoelectric flap includes a first portion suspended over the first part of the opening;

at least one of the first top electrode, the first bottom electrode, or the first middle electrode extend no more than half of a first length of the first portion;

the second piezoelectric flap includes a second portion suspended over the second part of the opening; and at least one of the second top electrode, the second bottom electrode, or the second middle electrode extend no more than half of a second length of the second portion.

15. The audio device of claim 14, wherein the at least one of the first top electrode, the first bottom electrode, or the first middle electrode extend between a quarter of the first length and half of the first length; and wherein the at least one of the second top electrode, the second bottom electrode, or the second middle electrode extend between a quarter of the second length and half of the second length.

16. The audio device of claim 14, wherein the first piezoelectric layer extends no more than half of the first length of the first portion, and the second piezoelectric layer extends no more than half of the second length of the second portion.

17. The audio device of claim 14, wherein the first bottom electrode is embedded in the first piezoelectric layer, and a first surface of the first bottom electrode is continuous with a second surface of the first piezoelectric layer; and wherein the second bottom electrode is embedded in the second piezoelectric layer, and a third surface of the second bottom electrode is continuous with a fourth surface of the second piezoelectric layer.

18. The audio device of claim 14, wherein the first bottom electrode is on a first surface of the second piezoelectric layer, the first surface and a second surface of the first bottom electrode being discontinuous; and wherein the second bottom electrode is on a third surface of the fourth piezoelectric layer, the third surface and a fourth surface of the second bottom electrode being discontinuous.

19. A method comprising:

driving a first piezoelectric flap of an audio device with a first electrical signal to generate an acoustic signal;

receiving a second electrical signal generated by a second piezoelectric flap of the audio device responsive to receiving at least a portion of the acoustic signal generated by the first piezoelectric flap, the second piezoelectric flap separated from the first piezoelectric flap by a gap;

determining a characteristic of the audio device based on the second electrical signal; and performing an action based on the characteristic.

20. The method of claim 19, wherein the characteristic includes at least one of: presence of foreign objects on the first and second piezoelectric flaps, presence of foreign objects in a back volume space of the audio device, or a gap distance between the first and second piezoelectric flaps exceeding a threshold.

21. The method of claim 19, wherein the action includes: driving the first piezoelectric flap at a first resonant frequency of the first piezoelectric flap, and driving the second piezoelectric flap at a second resonant frequency of the second piezoelectric flap.

22. The method of claim 19, wherein the action includes enabling a heater of the audio device.

\* \* \* \* \*